US 11,488,994 B2

(12) United States Patent
Kawazoe

(10) Patent No.: US 11,488,994 B2
(45) Date of Patent: Nov. 1, 2022

(54) SOLID-STATE IMAGING DEVICE AND SOLID-STATE IMAGING ELEMENT

(71) Applicant: SONY SEMICONDUCTOR SOLUTIONS CORPORATION, Kanagawa (JP)

(72) Inventor: Takanobu Kawazoe, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 152 days.

(21) Appl. No.: 16/971,433

(22) PCT Filed: Jan. 21, 2019

(86) PCT No.: PCT/JP2019/001625
§ 371 (c)(1),
(2) Date: Aug. 20, 2020

(87) PCT Pub. No.: WO2019/171789
PCT Pub. Date: Sep. 12, 2019

(65) Prior Publication Data
US 2021/0005655 A1    Jan. 7, 2021

(30) Foreign Application Priority Data
Mar. 7, 2018 (JP) .............................. JP2018-041315

(51) Int. Cl.
*H01L 27/146*    (2006.01)
(52) U.S. Cl.
CPC .... *H01L 27/14618* (2013.01); *H01L 27/1464* (2013.01); *H01L 27/14621* (2013.01);
(Continued)

(58) Field of Classification Search
CPC ......... H01L 27/14618; H01L 27/14621; H01L 27/14623; H01L 27/14627;
(Continued)

(56) References Cited

U.S. PATENT DOCUMENTS

2004/0016983 A1    1/2004  Misawa
2010/0200898 A1*   8/2010  Lin ................... H01L 27/14632
                                                    257/E31.11
(Continued)

FOREIGN PATENT DOCUMENTS

JP    2004-055674 A    2/2004
JP    2004-296453 A    10/2004
(Continued)

OTHER PUBLICATIONS

International Search Report and Written Opinion of PCT Application No. PCT/JP2019/001625, dated Mar. 19, 2019, 07 pages of ISRWO.

*Primary Examiner* — Nelson Garces
(74) *Attorney, Agent, or Firm* — Chip Law Group

(57) ABSTRACT

To prevent peeling at an interface between layers forming a layer structure of a solid-state imaging element even in a case where stress is caused by an increase in pressure in a cavity in a configuration in which a translucent member is provided on the solid-state imaging element with a support portion interposed therebetween and the cavity is formed between the solid-state imaging element and the translucent member. There are included a solid-state imaging element, the light-receiving side of which corresponds to one of plate surface sides of a semiconductor substrate; a translucent member provided on the light-receiving side of the solid-state imaging element at a predetermined distance therefrom; and a support portion that forms a cavity between the solid-state imaging element and the translucent member, in which the solid-state imaging element has a layer structure
(Continued)

provided on the light-receiving side of the semiconductor substrate, the layer structure including a first layer, a second layer, and a third layer, the second layer being different in material from the first layer, the third layer being different in material from the first layer and formed in the second layer, and the third layer has a protrusion-and-recess shape portion at least in a region where the support portion is formed in a planar direction along the plate surface of the semiconductor substrate, the protrusion-and-recess shape portion forming an interface between the second layer and the third layer in a protrusion-and-recess shape.

7 Claims, 16 Drawing Sheets

(52) U.S. Cl.
CPC .. *H01L 27/14623* (2013.01); *H01L 27/14627* (2013.01); *H01L 27/14636* (2013.01); *H01L 27/14645* (2013.01); *H01L 27/14698* (2013.01)

(58) Field of Classification Search
CPC .......... H01L 27/14636; H01L 27/1464; H01L 27/14645; H01L 27/14698; H01L 27/14605; H01L 27/14643; H01L 27/14685; H04N 5/335; H04N 5/369
See application file for complete search history.

(56) References Cited

U.S. PATENT DOCUMENTS

| | | | |
|---|---|---|---|
| 2010/0321544 A1* | 12/2010 | Matsuo | H01L 27/14627 257/E21.597 |
| 2015/0325606 A1* | 11/2015 | Togashi | H01L 27/1464 257/443 |
| 2016/0079293 A1 | 3/2016 | Ishii et al. | |
| 2019/0252327 A1* | 8/2019 | Hachisu | H01L 27/14687 |

FOREIGN PATENT DOCUMENTS

| | | |
|---|---|---|
| JP | 2007-150708 A | 6/2007 |
| JP | 2008-185744 A | 8/2008 |
| JP | 2016-058699 A | 4/2016 |

* cited by examiner

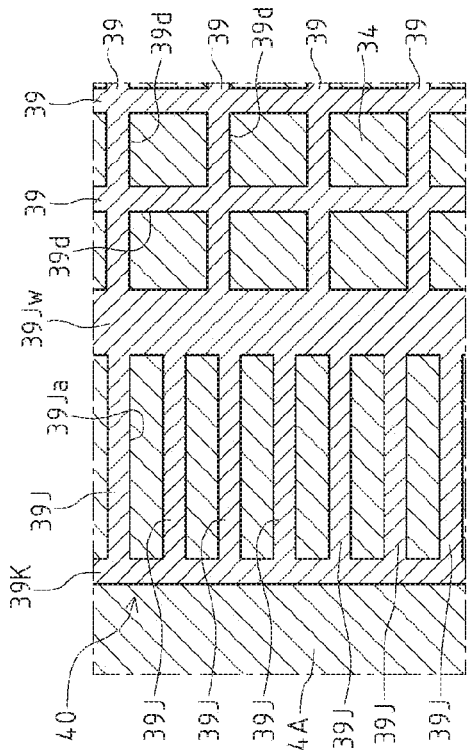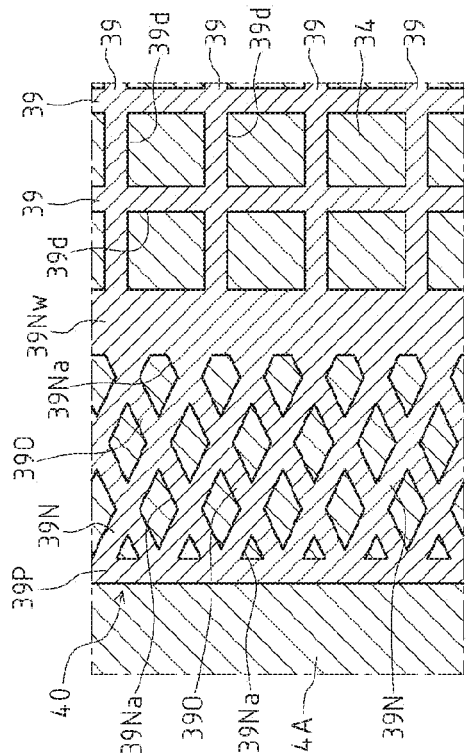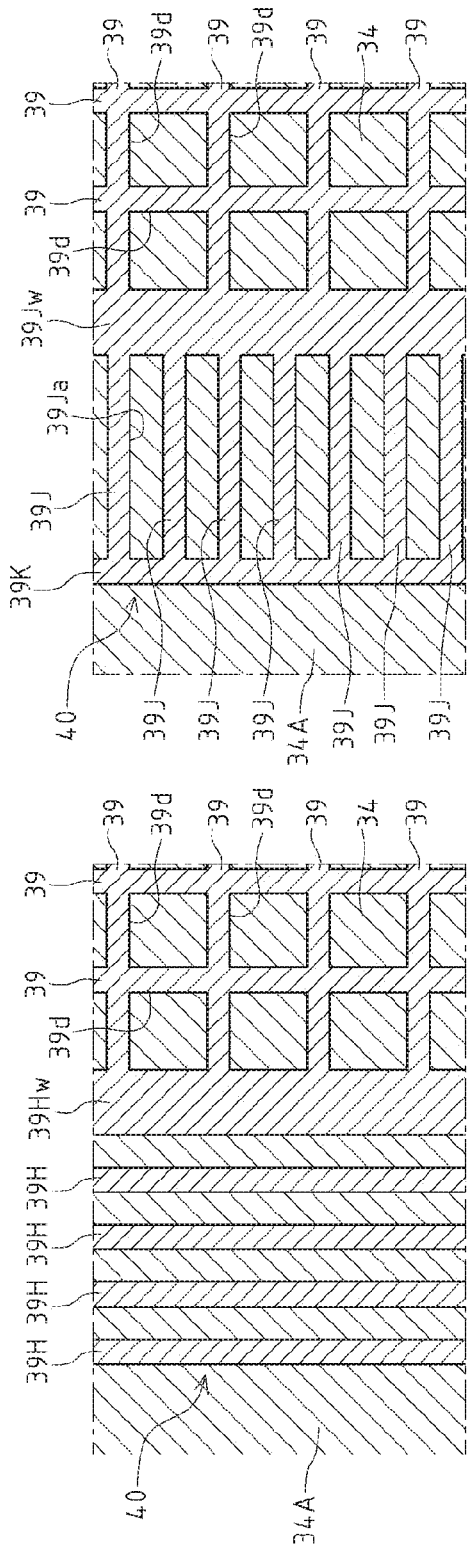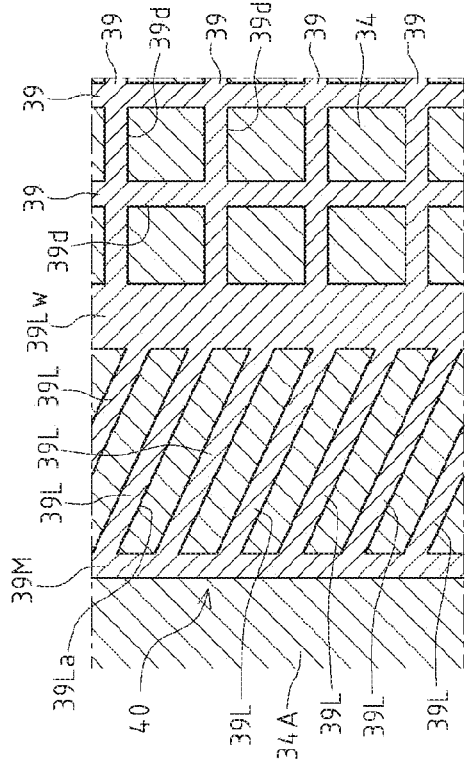

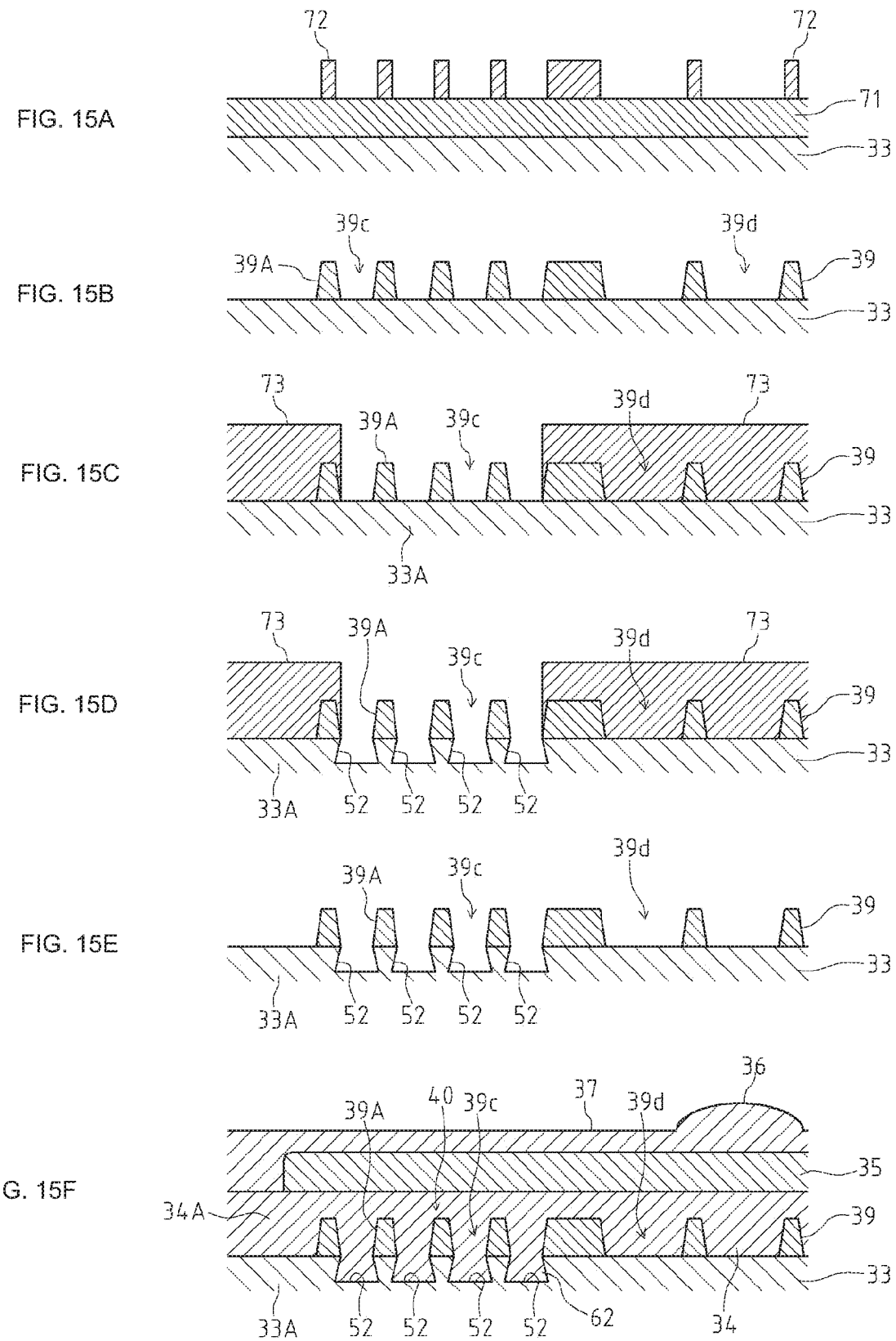

SOLID-STATE IMAGING DEVICE AND SOLID-STATE IMAGING ELEMENT

CROSS REFERENCE TO RELATED APPLICATIONS

This application is a U.S. National Phase of International Patent Application No. PCT/JP2019/001625 filed on Jan. 21, 2019, which claims priority benefit of Japanese Patent Application No. JP 2018-041315 filed in the Japan Patent Office on Mar. 7, 2018. Each of the above-referenced applications is hereby incorporated herein by reference in its entirety.

TECHNICAL FIELD

The present technology relates to a solid-state imaging device and a solid-state imaging element.

BACKGROUND ART

In order to achieve miniaturization or the like of devices, some of conventional solid-state imaging devices including complementary metal oxide semiconductor (CMOS) or charge coupled device (CCD) image sensors as solid-state imaging elements adopt the following configuration. That is, such a configuration includes a package structure in which a glass sheet as a translucent member is mounted on the image sensor with a support portion including resin or the like interposed therebetween, and a cavity is provided between the image sensor and the glass sheet.

In such a configuration, the glass sheet is supported by the support portion provided on a light-receiving surface side of the image sensor in such a way as to face the light-receiving surface of the image sensor. In addition, a gap between the image sensor and the glass sheet is sealed with the support portion to form a cavity surrounded by the support portion between the image sensor and the glass sheet (see, for example, Patent Document 1).

Patent Document 1 discloses a configuration in which an adhesive portion serves as the support portion that supports the glass sheet on the image sensor. The adhesive portion is formed in a region except an effective pixel region formed on the light-receiving surface side of the image sensor, and bonds the image sensor and the glass sheet. The adhesive portion supporting the glass sheet is formed on the image sensor by, for example, application with a dispenser, or patterning using a photolithography technique. In a solid-state imaging device with such a configuration, light having passed through the glass sheet passes through the cavity to be received and detected by a light-receiving element included in each pixel arranged in the effective pixel region of the image sensor.

CITATION LIST

Patent Document

Patent Document 1: Japanese Patent Application Laid-Open No. 2004-296453

SUMMARY OF THE INVENTION

Problems to be Solved by the Invention

In the solid-state imaging device with a configuration as described above, for example, a hygroscopic treatment and a reflow process are performed as preprocessing for the reliability test of the device. When such preprocessing is performed, a water vapor pressure in the cavity increases during the reflow process, so that stress is applied to the package structure. Such stress acts mainly in the direction of expanding the cavity, that is, in the direction of separating the image sensor and the glass sheet from each other.

In this way, the stress generated in the package structure acts on the support portion adhering to a surface portion of the image sensor. This may cause peeling at the interface between relatively weakly bonded layers in the layer structure of the image sensor located below the support portion in a case where the solid-state imaging device is placed with the glass side up. Examples of a combination of layers forming an interface with a relatively low adhesion include a combination of a metal film serving as a light-shielding film and an organic film including an organic material serving as a flattening film in an image sensor.

An object of the present technology is to provide a solid-state imaging device and a solid-state imaging element capable of preventing peeling at an interface between layers forming a layer structure of the solid-state imaging element even in a case where stress is caused by an increase in pressure in a cavity in a configuration in which a translucent member is provided on the solid-state imaging element with a support portion interposed therebetween and the cavity is formed between the solid-state imaging element and the translucent member.

Solutions to Problems

A solid-state imaging device according to the present technology includes: a solid-state imaging element including a semiconductor substrate, one of plate surface sides of the semiconductor substrate being defined as a light-receiving side; a translucent member provided on the light-receiving side of the solid-state imaging element at a predetermined distance from the solid-state imaging element; and a support portion that is provided on the light-receiving side of the solid-state imaging element, and supports the translucent member with respect to the solid-state imaging element in such a way as to form a cavity between the solid-state imaging element and the translucent member, in which the solid-state imaging element has a layer structure provided on the light-receiving side of the semiconductor substrate, the layer structure including a first layer, a second layer, and a third layer, the second layer being different in material from the first layer and formed on the first layer, the third layer being different in material from the first layer and formed in the second layer on the first layer, and the third layer has a protrusion-and-recess shape portion at least in a region where the support portion is formed in a planar direction along the plate surface of the semiconductor substrate, the protrusion-and-recess shape portion forming an interface between the second layer and the third layer in a protrusion-and-recess shape.

Furthermore, another aspect of the solid-state imaging device according to the present technology is the solid-state imaging device in which the support portion includes a resin material, and is provided in a peripheral region that is a region other than a light-receiving region on the light-receiving side of the solid-state imaging element, the second layer is a flattening film including an organic material, and the third layer is a light-shielding film including a metal material.

Moreover, another aspect of the solid-state imaging device according to the present technology is the solid-state imaging device in which the protrusion-and-recess shape portion is formed in such a way as to partially cover a surface of the first layer.

In addition, another aspect of the solid-state imaging device according to the present technology is the solid-state imaging device in which the first layer has a recessed portion continuous with a recess of the protrusion-and-recess shape portion, and the second layer has a protruding portion on the third layer side, the protruding portion being formed as a result of filling the recessed portion through the recess.

Furthermore, another aspect of the solid-state imaging device according to the present technology is the solid-state imaging device in which the recessed portion is an excavation that forms a key-like protrusion-and-recess shape together with other recessed portions in a cross-sectional view of the layer structure.

Moreover, another aspect of the solid-state imaging device according to the present technology is the solid-state imaging device in which the recessed portion has a trapezoidal groove shape gradually increasing in width from the light-receiving side toward an opposite side in a direction of thickness of the layer structure in a cross-sectional view of the layer structure.

A solid-state imaging element according to the present technology includes: a semiconductor substrate, one of plate surface sides of the semiconductor substrate being defined as a light-receiving side on which a support portion is provided in such a way as to be interposed between the semiconductor substrate and a translucent member to be disposed, in which the solid-state imaging element has a layer structure provided on the light-receiving side of the semiconductor substrate, the layer structure including a first layer, a second layer, and a third layer, the second layer being different in material from the first layer and formed on the first layer, the third layer being different in material from the first layer and formed in the second layer on the first layer, and the third layer has a protrusion-and-recess shape portion at least in a region where the support portion is formed in a planar direction along the plate surface of the semiconductor substrate, the protrusion-and-recess shape portion forming an interface between the second layer and the third layer in a protrusion-and-recess shape.

Effects of the Invention

According to the present technology, it is possible to prevent peeling at the interface between the layers forming the layer structure of the solid-state imaging element even in a case where stress is caused by an increase in pressure in the cavity in the configuration in which the translucent member is provided on the solid-state imaging element with the support portion interposed therebetween and the cavity is formed between the solid-state imaging element and the translucent member.

BRIEF DESCRIPTION OF DRAWINGS

FIGS. 11A, 11B, 11C, and 11D are plan sectional views of configurations of modified examples of the solid-state imaging element according to the first embodiment of the present technology.

FIGS. 15A, 15B, 15C, 15D, 15E, and 15F are explanatory diagrams showing an example of a method for manufacturing the solid-state imaging device according to the second embodiment of the present technology.

MODE FOR CARRYING OUT THE INVENTION

Figure 1:
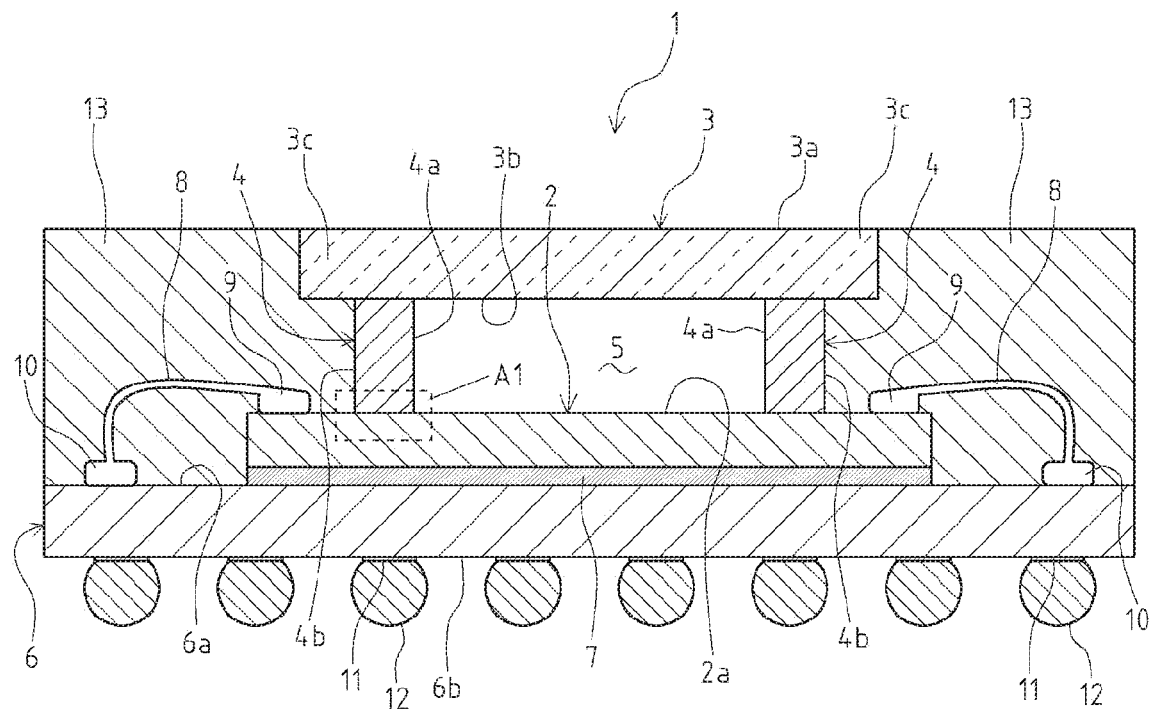
FIG. 1 is a cross-sectional view of a configuration of a solid-state imaging device according to a first embodiment of the present technology.

The present technology is intended to prevent interlayer peeling due to stress caused by an increase in pressure in a cavity by elaborating, for example, the shape of the layer structure of a solid-state imaging element in a configuration in which a translucent member is provided on the solid-state imaging element with a support portion interposed therebetween and the cavity is formed between the solid-state imaging element and the translucent member.

Hereinafter, modes for carrying out the present technology (hereinafter referred to as "embodiments") will be described with reference to the drawings. In the drawings, the same or similar parts are denoted by the same or similar reference signs. However, the drawings are schematic, and the dimensional ratios and the like of the parts do not necessarily match actual ones. Furthermore, it is needless to say that, for some of the parts, dimensional relationships and ratios also differ between the drawings. Additionally, the embodiments will be described in the following order.

1. First Embodiment
2. Modified Examples of First Embodiment
3. Second Embodiment
4. Modified Example of Second Embodiment
5. Third Embodiment
6. Modified Example of Third Embodiment 1. First Embodiment

[Configuration of Solid-State Imaging Device]

A configuration of a solid-state imaging device 1 according to a first embodiment of the present technology will be described with reference to FIG. 1. The solid-state imaging device 1 according to the present embodiment is a CMOS solid-state imaging device that includes a CMOS image sensor 2 as a solid-state imaging element. As shown in FIG. 1, the solid-state imaging device 1 includes the image sensor 2, a glass sheet 3, and a rib resin portion 4. The glass sheet 3 serves as a translucent member. The rib resin portion 4 serves as a support portion that supports the glass sheet 3 on the image sensor 2.

The solid-state imaging device 1 has a package structure in which the glass sheet 3 is mounted on the image sensor 2 with the rib resin portion 4 interposed therebetween and a cavity 5 is formed between the image sensor 2 and the glass sheet 3. Such a structure is adopted for the purpose of, for example, miniaturizing the device.

In the solid-state imaging device 1, the glass sheet 3 is supported by the rib resin portion 4 provided on an upper surface 2a, which is a surface on a light-receiving side of the image sensor 2, in such a way as to face the upper surface 2a of the image sensor 2. In addition, a gap between the image sensor 2 and the glass sheet 3 is sealed with the rib resin portion 4 to form a cavity 5 surrounded by the rib resin portion 4 between the image sensor 2 and the glass sheet 3.

The configuration in which the cavity 5 is formed in the solid-state imaging device 1 is mounted on an interposer substrate 6 that includes, for example, an organic material such as plastic, or ceramics. The interposer substrate 6 has a front surface 6a and a back surface 6b. The front surface 6a is a plate surface on a side where the configuration in which the cavity 5 is formed is mounted. The back surface 6b is a plate surface on the opposite side. The image sensor 2 is die-bonded to the front surface 6a side of the interposer substrate 6 with an insulating or conductive paste 7.

Figure 4:
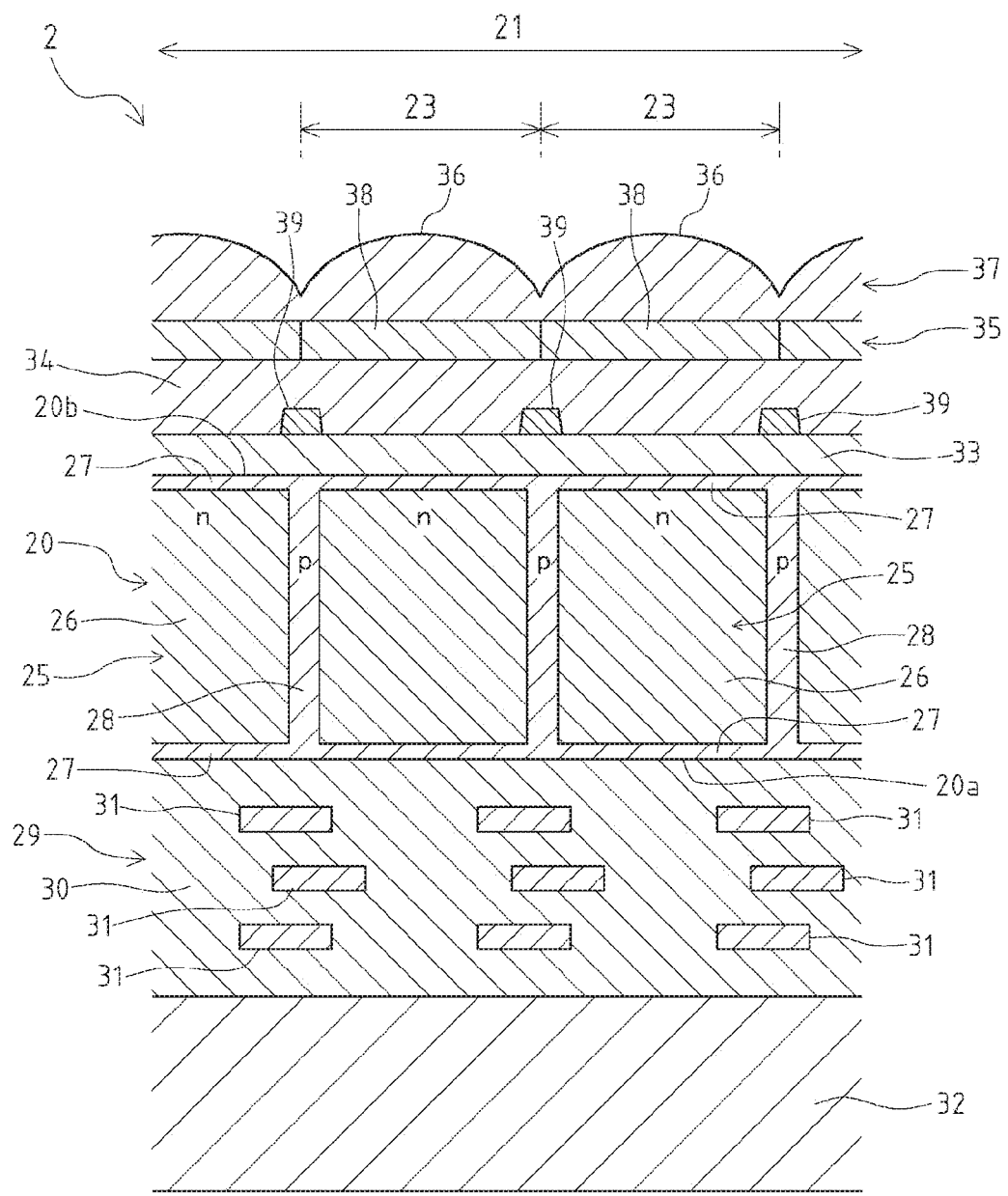
FIG. 4 is a cross-sectional view of a configuration of a solid-state imaging element according to the first embodiment of the present technology.

The image sensor 2 includes a semiconductor substrate 20 (see FIG. 4). One of plate surface sides (upper side in FIG. 1) of the semiconductor substrate 20 is defined as a light-receiving side. The image sensor 2 is a rectangular plate-like chip. A plate surface on one side (light-receiving side) is referred to as the upper surface 2a. The image sensor 2 is bonded onto the interposer substrate 6 with the paste 7 such that a lower surface 2b, which is a plate surface on a side opposite to the upper surface 2a, faces the front surface 6a of the interposer substrate 6.

As described above, in the image sensor 2 according to the present embodiment, the rib resin portion 4 is provided on the light-receiving side of the semiconductor substrate 20, and the glass sheet 3 is disposed with the rib resin portion 4 interposed between the glass sheet 3 and the semiconductor substrate 20. The image sensor 2 has a pixel region 21 and a peripheral region 22 on the upper surface 2a side. The pixel region 21 serves as a light-receiving region, and the peripheral region 22 is provided around the pixel region (see FIG. 5). The specific configuration of the image sensor 2 will be described later.

The glass sheet 3 is provided on the light-receiving side of the image sensor 2 at a predetermined distance from the image sensor 2. The glass sheet 3 is an example of a transparent member, and is a rectangular plate-like member that is one size smaller than the image sensor 2.

The glass sheet 3 is provided in parallel with the image sensor 2 such that the glass sheet 3 is located in the range of the outer shape of the image sensor 2 in a plan view. The glass sheet 3 has a lower surface 3b and an upper surface 3a. The lower surface 3b is a plate surface on a side facing the image sensor 2. The upper surface 3a is a surface on the opposite side. Light having passed through the glass sheet 3 enters a light-receiving surface of the image sensor 2.

The rib resin portion 4 is provided on the light-receiving side of the image sensor 2, and supports the glass sheet 3 with respect to the image sensor 2 to form the cavity 5 between the image sensor 2 and the glass sheet 3. The rib resin portion 4 is an adhesive that bonds the image sensor 2 and the glass sheet 3 such that the image sensor 2 and the glass sheet 3 are disposed separately from each other. The rib resin portion 4 functions as a sealing resin portion that seals the gap between the image sensor 2 and the glass sheet 3. The rib resin portion 4 is bonded to the upper surface 2a of the image sensor 2 and the lower surface 3b of the glass sheet 3.

The rib resin portion 4 is formed to extend over the entire circumference along the outer shape of the glass sheet 3. The rib resin portion 4 is provided such that the rib resin portion 4 has a rectangular frame shape in a plan view. The rib resin portion 4 is provided inside the outer edge of the glass sheet 3 in a plan view. Therefore, an outer edge portion 3c of the glass sheet 3 is a protruding portion that protrudes outward from the rib resin portion 4. The rib resin portion 4 is provided in the peripheral region 22 on the upper surface 2a of the image sensor 2.

Examples of the material of the rib resin portion 4 include a photosensitive adhesive such as an ultraviolet (UV) curable resin which is an acrylic resin, a thermosetting resin such as an epoxy resin, and a mixture thereof. However, the material of the rib resin portion 4 is not particularly limited as long as the material of the rib resin portion 4 is a resin material that functions as an adhesive. The rib resin portion 4 is formed on the upper surface 2a of the image sensor 2 by, for example, application with a dispenser, or patterning using a photolithography technique.

As described above, in the present embodiment, the rib resin portion 4 includes a resin material, and is provided in the peripheral region 22 which is a region other than the pixel region 21 serving as the light-receiving region on the light-receiving side of the image sensor 2.

The cavity 5 is a flat rectangular space between the image sensor 2 and the glass sheet 3. The cavity 5 is formed by the upper surface 2a of the image sensor 2, the lower surface 3b of the glass sheet 3, and an inner side surface 4a of the rib resin portion 4.

In the solid-state imaging device 1, the image sensor 2 and the interposer substrate 6 are electrically connected by a plurality of bonding wires 8. The bonding wire 8 is a thin metal wire of, for example, gold (Au) or copper (Cu), and electrically connects a pad electrode 9 and a lead electrode 10. The pad electrode 9 is formed on the upper surface 2a of the image sensor 2. The lead electrode 10 is formed on the front surface 6a of the interposer substrate 6.

The lead electrode 10 on the interposer substrate 6 is connected to a plurality of terminal electrodes 11 exposed on the back surface 6b of the interposer substrate 6 via a wiring pattern or the like formed in the interposer substrate 6. A solder ball 12 is attached to each terminal electrode 11. The solder ball 12 serves as a terminal for establishing electrical connection to a circuit board on which the solid-state imaging device 1 is mounted in a predetermined device to which the solid-state imaging device 1 is applied.

Furthermore, in the solid-state imaging device 1, a space around the bonding wire 8, which is a portion outside the cavity 5 on the interposer substrate 6, is covered and sealed with a molding resin 13. Specifically, the molding resin 13 covers a part of the front surface 6a of the interposer substrate 6 where the lead electrode 10 is formed, a side surface of the image sensor 2, a peripheral part of the upper surface 2a of the image sensor 2 where the pad electrode 9 is formed, an outer side surface 4b of the rib resin portion 4, the outer edge portion 3c of the glass sheet 3, and the like. The molding resin 13 is, for example, a thermosetting resin containing a filler containing silicon oxide as a main ingredient.

In the solid-state imaging device 1 with the configuration as described above, light having passed through the glass sheet 3 passes through the inside of the cavity 5 to be received and detected by a light-receiving element included in each of pixels 23 arranged in the pixel region 21 of the image sensor 2.

[Method for Manufacturing Solid-State Imaging Device]

An example of a method for manufacturing the solid-state imaging device 1 according to the present embodiment will be described with reference to FIGS. 2A, 2B, 2C, 2D, 2E, 3A, 3B, and 3C. In the method for manufacturing the solid-state imaging device 1 to be described below, a plurality of the solid-state imaging devices 1 is manufactured simultaneously.

Figure 2A:
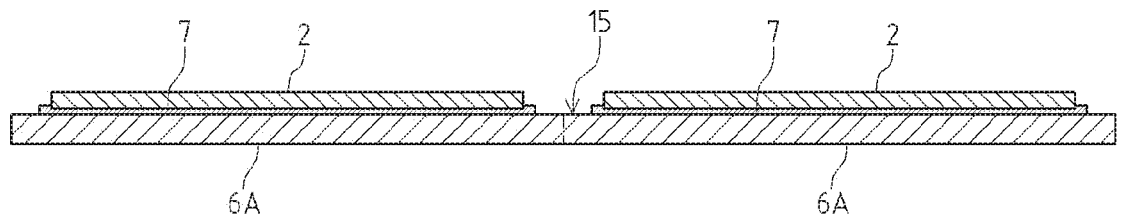
FIGS. 2A, 2B, 2C, 2D, and 2E are explanatory diagrams showing a method for manufacturing the solid-state imaging device according to the first embodiment of the present technology.

First, as shown in FIG. 2A, prepared is a substrate 15 that includes a plurality of substrate portions 6A, each of which is to be the interposer substrate 6 in the solid-state imaging device 1. The plurality of substrate portions 6A is two-dimensionally arranged to form the substrate 15. A die-bonding step of die-bonding the image sensor 2 to each of the substrate portions 6A is performed on the substrate 15. In this step, the image sensor 2 is bonded onto each substrate portion 6A forming the substrate 15 with the paste 7, as shown in FIG. 2A.

Figure 2B:
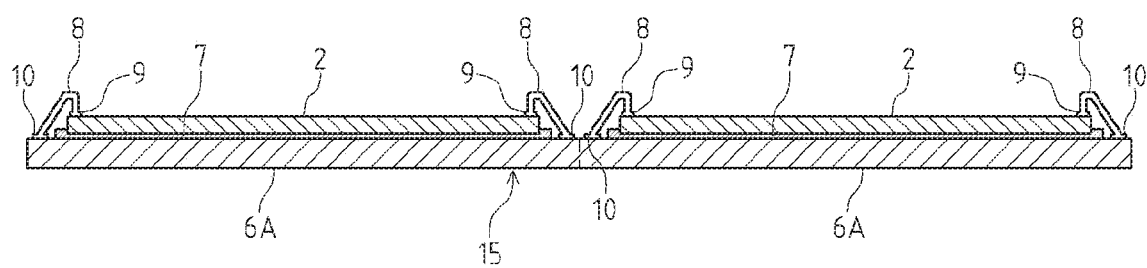

Next, a wire bonding step is performed as shown in FIG. 2B. In the wire bonding step, the pad electrode 9 of the image sensor 2 and the lead electrode 10 of the interposer substrate 6 are electrically connected by the bonding wire 8.

Figure 2C:
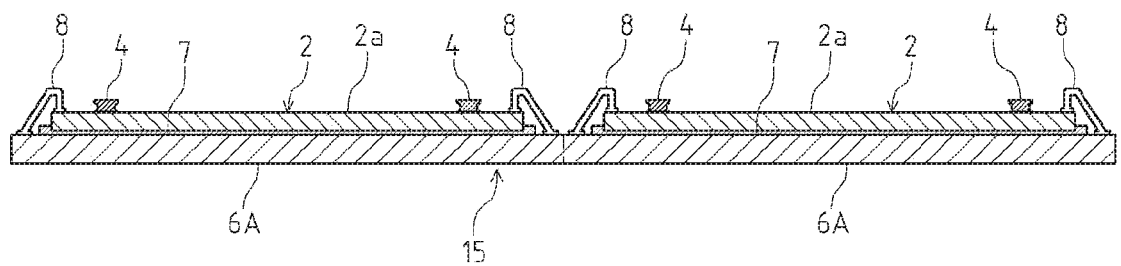
Figure 2D:
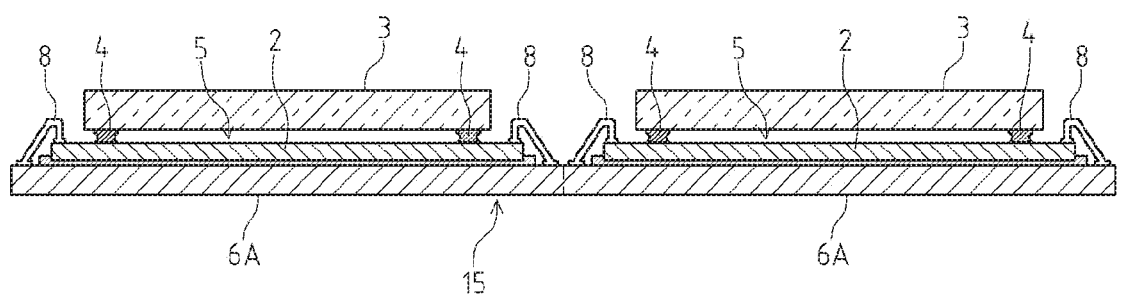

Thereafter, as shown in FIGS. 2C and 2D, a glass bonding step is performed in which the glass sheet 3 is mounted on each image sensor 2. First, in this step, a resin material for forming the rib resin portion 4 is applied by a dispenser to a predetermined portion of the peripheral region 22 on the upper surface 2a of the image sensor 2, as shown in FIG. 2C. Here, the resin material for forming the rib resin portion 4 is applied in such a way as to form a rectangular frame shape in a plan view while being discharged from the nozzle of the dispenser. However, the rib resin portion 4 may be formed by, for example, patterning using a photolithography technique instead of application with the dispenser.

Then, as shown in FIG. 2D, the glass sheet 3 is mounted on the rib resin portion 4 applied onto the image sensor 2, and the rib resin portion 4 bonds the glass sheet 3 to the image sensor 2 such that the glass sheet 3 is located at a predetermined distance from the image sensor 2. As a result, the cavity 5 is formed between the image sensor 2 and the glass sheet 3.

Figure 2E:
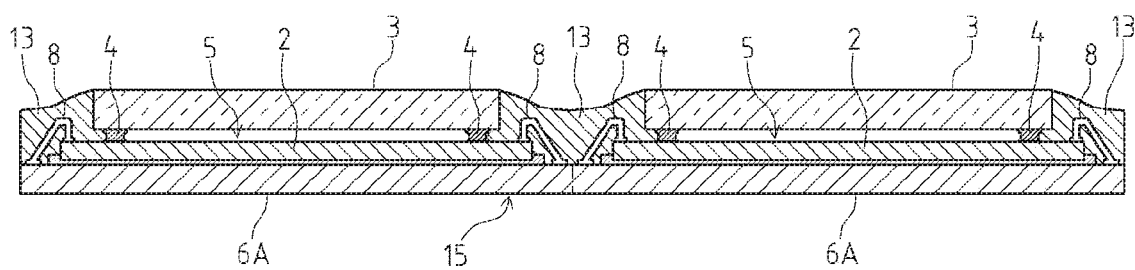

Subsequently, as shown in FIG. 2E, a wire sealing step is performed in which a portion around the bonding wire 8, which is a portion outside the cavity 5 on the interposer substrate 6, is covered with the molding resin 13. The molding resin 13 is formed by injection of a resin material for forming the molding resin 13. For example, a mold is used for injection of the resin material.

Figure 3A:
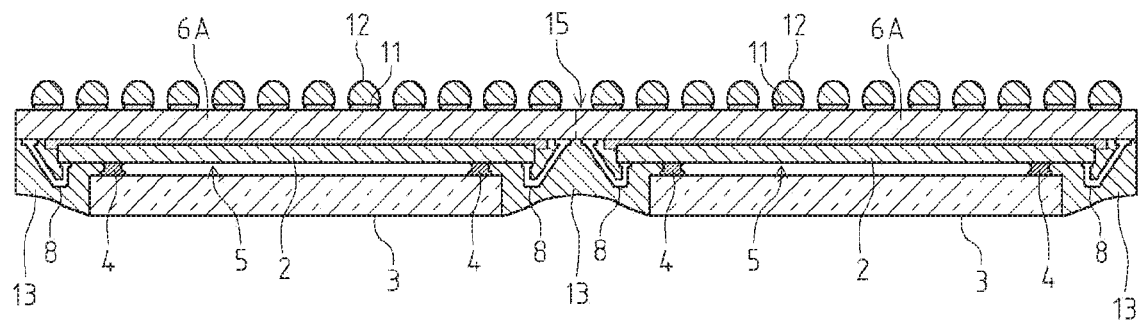
FIGS. 3A, 3B, and 3C are explanatory diagrams showing the method for manufacturing the solid-state imaging device according to the first embodiment of the present technology.

Next, as shown in FIG. 3A, a ball mounting step is performed in which the solder balls 12 are formed on the back surface 6b side of the interposer substrate 6. In this step, as shown in FIG. 3A, the solder ball 12 is mounted on each terminal electrode 11 exposed on the back surface 6b of the interposer substrate 6.

Figure 3B:
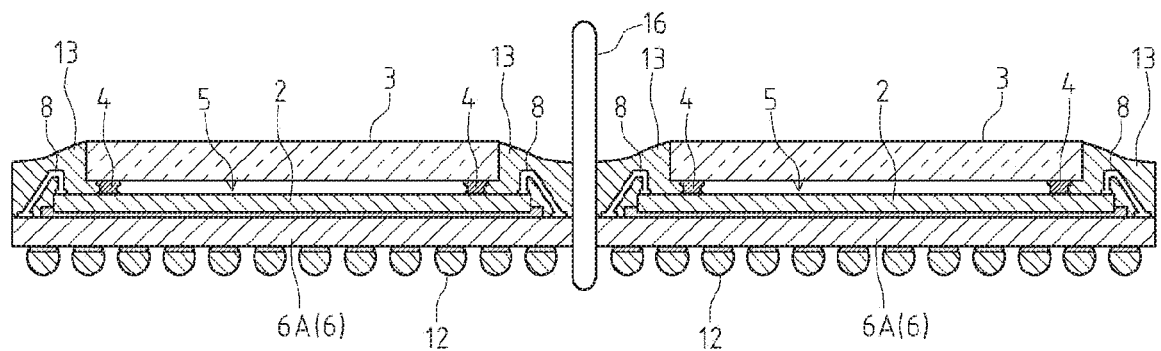

Then, as shown in FIG. 3B, a dicing step is performed in which the substrate 15 and a plurality of device elements configured on the substrate 15 are divided into individual pieces in units of devices. In this step, as shown in FIG. 3B, division into individual pieces is performed by a dicing blade 16, which divides a part where the molding resin 13 is located and the substrate 15 such that the substrate 15 is divided into each substrate portion 6A.

Figure 3C:
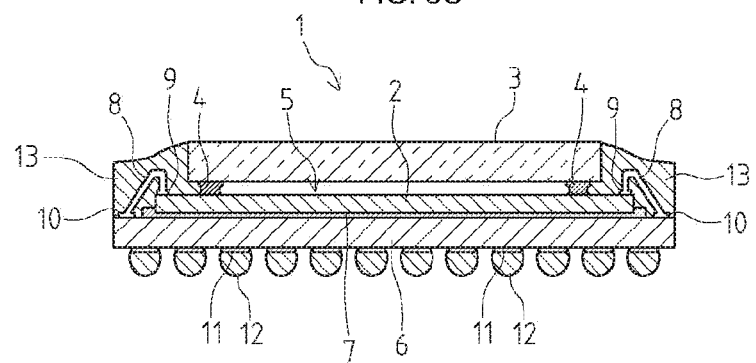

As a result of performing the manufacturing process as described above, a plurality of the solid-state imaging devices 1 can be simultaneously obtained as shown in FIG. 3C.

[Configuration of Image Sensor]

The configuration of the image sensor 2 according to the present embodiment will be described with reference to FIGS. 4 and 5. The image sensor 2 includes the semiconductor substrate 20 including a semiconductor such as silicon. The image sensor 2 has the pixel region 21 and the peripheral region 22 provided around the pixel region 21.

The pixel region 21 is an imaging region provided on the semiconductor substrate 20, and includes a plurality of the pixels 23 arranged in a predetermined array. The pixel region 21 includes an effective pixel region in which a signal charge is generated, amplified, and read by photoelectric conversion in each pixel 23.

The pixel 23 includes a photodiode 25 and a plurality of MOS transistors. The photodiode 25 serves as a photoelectric conversion unit having a photoelectric conversion function. The photodiode 25 has a light-receiving surface, and generates a signal charge of an amount corresponding to the light quantity (intensity) of light incident on the light-receiving surface. The photodiode 25 is formed in such a way as to extend over the entire area of the semiconductor substrate 20 in its thickness direction, and receives light incident on a back surface 20b side (upper side in FIG. 4) of the semiconductor substrate 20.

In the present embodiment, the photodiode 25 has an n-type semiconductor region 26 and a p-type semiconductor region 27. The n-type semiconductor region 26 serves as a charge storage region for storing charges (electrons). The p-type semiconductor region 27 is formed in such a way as to face both front and back surfaces of the semiconductor substrate 20. Thus, the photodiode 25 is configured as a pn junction photodiode. The p-type semiconductor region 27 functions as a hole charge storage region for reducing dark current.

In addition, each of the plurality of MOS transistors included in the pixel 23 has the function of, for example, amplification, transfer, selection, or reset of signal charges generated by the photodiode 25. The signal charges (for example, electrons) stored in the photodiode 25 are read via a transfer transistor or the like, and output as an electric signal to a predetermined signal line.

The plurality of pixels 23 is electrically isolated from each other by a pixel isolation region 28. The pixel isolation region 28 is formed as the p-type semiconductor region, and is grounded. The photodiode 25 is provided in a region partitioned by the pixel isolation region 28. The pixel isolation region 28 is formed in a grid-like shape in a plan view in such a way as to form boundaries between the plurality of pixels 23.

A wiring layer 29 is provided on a front surface 20a side of the semiconductor substrate 20. The front surface 20a is one of plate surfaces of the semiconductor substrate 20. The wiring layer 29 includes an interlayer insulating film 30 and a plurality of wires 31 layered with the interlayer insulating film 30 interposed therebetween. The interlayer insulating film 30 and the wires 31 are alternately layered such that the wiring layer 29 includes a plurality of layers of the interlayer insulating film 30 and the wires 31. Thus, the wiring layer 29 is a so-called multilayer wiring layer.

The interlayer insulating film 30 is, for example, a silicon oxide film including silicon dioxide ($SiO_2$). The plurality of wires 31 is electrically connected to each other in the interlayer insulating film 30. The wire 31 is, for example, a wire connected to the transfer transistor or the like for reading charges from the photodiode 25. Note that although the wiring layer 29 is a multilayer wiring layer including the plurality of wires 31, the wiring layer 29 is not limited thereto and may be a wiring layer with a single-layer structure.

A support substrate 32 is provided on a side of the wiring layer 29 opposite to the semiconductor substrate 20 side. The support substrate 32 is a substrate including, for example, a silicon semiconductor having a thickness of several hundred μm.

An oxide film 33 is provided on the back surface 20b of the semiconductor substrate 20, which is the other plate surface of the semiconductor substrate 20. The oxide film 33 is an insulating film that functions as an antireflection film. The oxide film 33 includes, for example, a silicon oxide film or the like.

A flattening film 34 with optical transparency is provided on the oxide film 33. The flattening film 34 includes, for example, an organic material such as a resin with insulation properties. A color filter layer 35 is formed on the flattening film 34. A lens layer 37 including a plurality of microlenses 36 is formed on the color filter layer 35. Light incident on the microlens 36 is received by the photodiode 25 via the color filter layer 35, the flattening film 34, and the like.

The color filter layer 35 is divided into a plurality of color filters 38 each provided for the corresponding pixel 23. Each color filter 38 is a filter portion corresponding to, for example, any color of red, green, and blue, and transmits light of each color component.

The microlens 36 is a so-called on-chip microlens, and is formed such that each microlens 36 is provided for the photodiode 25 of the corresponding pixel 23. The microlens 36 collects incident light from the outside on the photodiode 25 of the corresponding pixel 23. The lens layer 37 forming the microlens 36 includes an organic material such as resin, for example, and is formed in such a way as to cover the entire surface of the image sensor 2.

Furthermore, a light-shielding film 39 is provided on the back surface 20b side of the semiconductor substrate 20 with the oxide film 33 interposed therebetween. The light-shielding film 39 blocks a part of light incident on the photodiode 25. The light-shielding film 39 is formed on the oxide film 33 along the boundary between the pixels 23 adjacent to each other, and is provided as an inter-pixel light-shielding portion. Therefore, the light-shielding film 39 is located above the pixel isolation region 28 in the semiconductor substrate 20.

The light-shielding film 39 is formed as a linear layer portion (ridge portion) along the substantially square outer shape of the pixel 23 in a plan view, and has a protruding shape on the oxide film 33 in a cross-sectional view. That is, the light-shielding film 39 is formed in a grid-like shape in a plan view in such a way as to open the upper side of each photodiode 25 and secure a path for light incident on the photodiode 25 (see FIG. 9).

The light-shielding film 39 is provided in the flattening film 34 on the oxide film 33, and is covered with the flattening film 34. Therefore, the light-shielding film 39 and the flattening film 34 are formed in such a way as to engage with each other in a layer thickness direction, and are partially formed such that the light-shielding film 39 and the flattening film 34 are located at a common position in the layer thickness direction.

The light-shielding film 39 includes a light-shielding material that blocks light. It is desirable to use, as a material for forming the light-shielding film 39, a material having high light-shielding properties and suitable for microfabrication so that the material can be processed accurately by etching, for example. Examples of materials having such characteristics include metals such as aluminum (Al), titanium (Ti), tungsten (W), and copper (Cu). Furthermore, the light-shielding film 39 is formed as, for example, a laminated film including a titanium film and a tungsten film, a laminated film including titanium nitride (TiN) and a tungsten film, or the like.

As described above, the image sensor 2 of the present embodiment has a backside-illumination type configuration in which the color filter layer 35 and the microlens 36 are provided on the back surface 20b side of the semiconductor substrate 20, which is the side opposite to the front surface 20a side on which the wiring layer 29 is provided. Then, the image sensor 2 includes the light-shielding film 39 as an inter-pixel light-shielding portion at a boundary portion between the pixels 23 adjacent to each other, between the semiconductor substrate 20 and the color filter layer 35.

Note that the image sensor 2 of the present embodiment is a backside-illumination type image sensor, but may be a frontside-illumination type image sensor in which a wiring layer is provided on the light incident side of the semiconductor substrate 20. For example, in the case of the frontside-illumination type configuration, a color filter layer and a microlens are formed on the same side as a wiring layer provided on one side of the semiconductor substrate 20, with the wiring layer interposed between the semiconductor substrate 20 and the formed color filter layer and microlens. In addition, a light-shielding film such as the light-shielding film 39 is provided on the wiring layer with an insulating film such as the oxide film 33 interposed therebetween.

Figure 5:
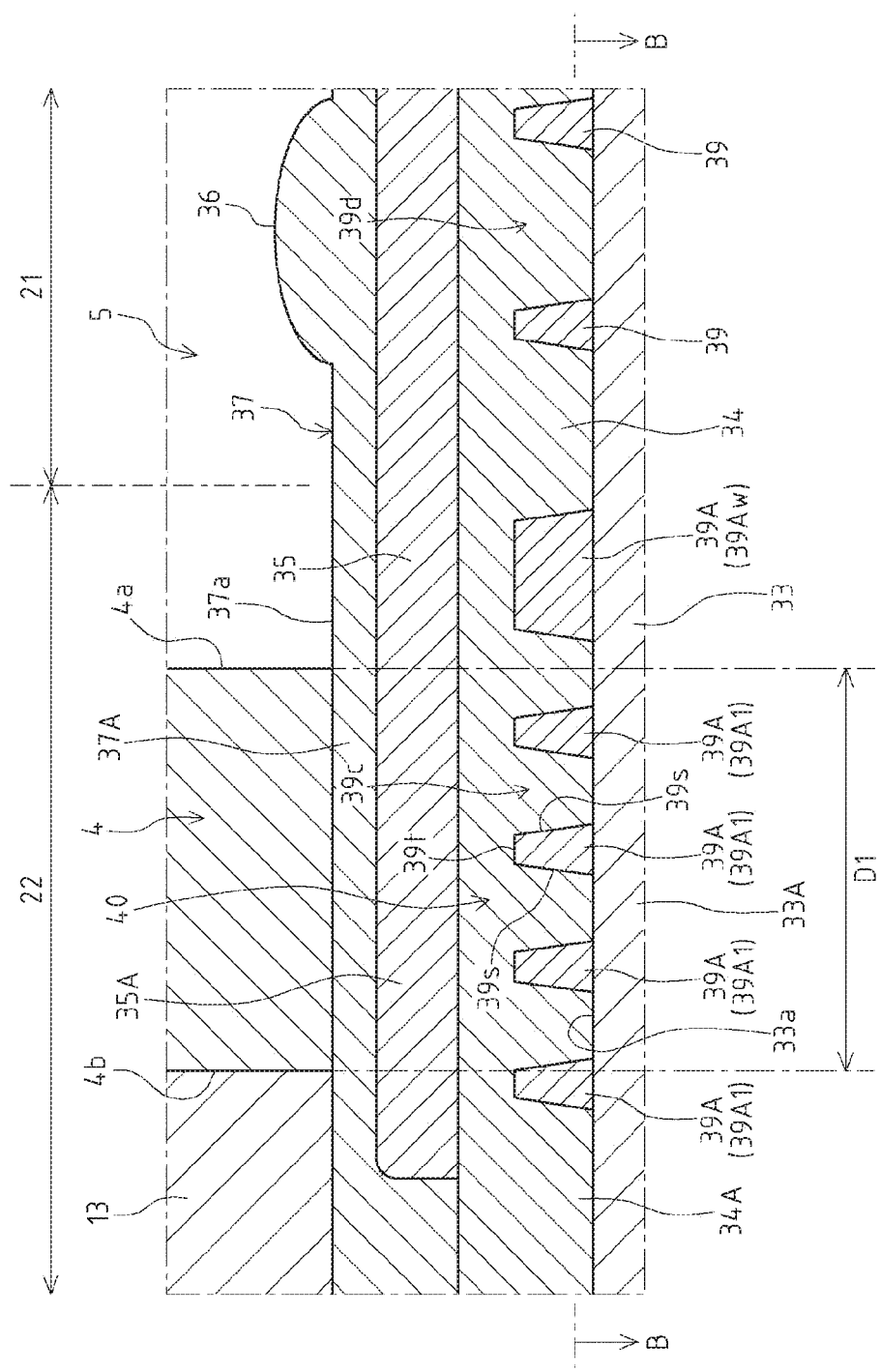
FIG. 5 is an enlarged view of part A1 in FIG. 1.

In the solid-state imaging device 1 including the image sensor 2 with the configuration as described above, the rib resin portion 4 and the molding resin 13 are formed in the peripheral region 22 on a surface 37a of the lens layer 37 serving as a surface layer of the image sensor 2, as shown in FIG. 5.

In the solid-state imaging device 1 according to the present embodiment with the configuration as described above, for example, a hygroscopic treatment and a reflow process are performed as preprocessing for the reliability test of the device. Here, an example of the preprocessing for the reliability test will be described with reference to FIG. 6.

Figure 6:
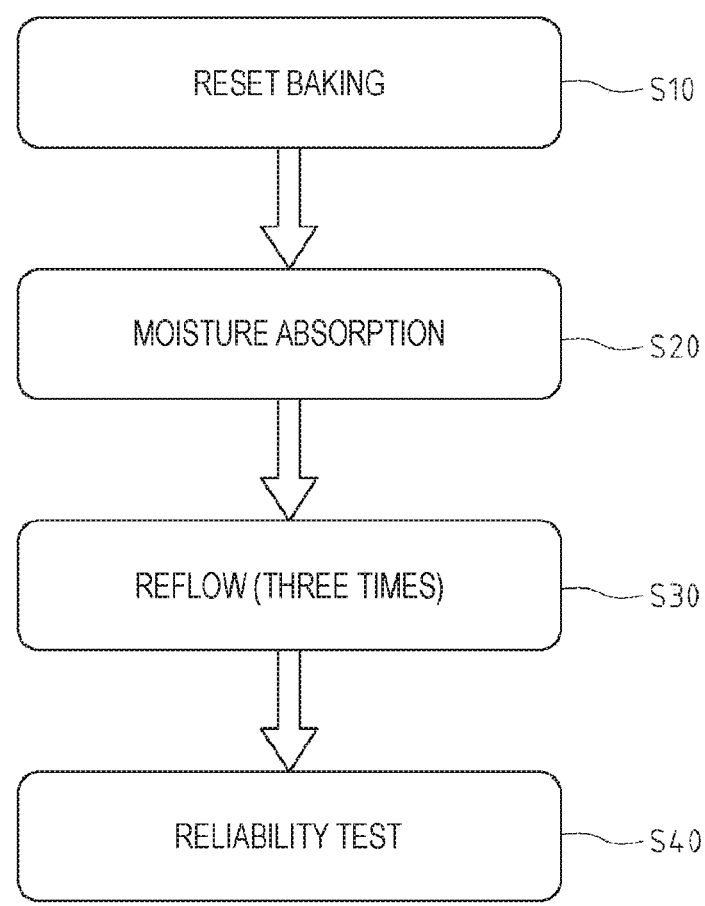
FIG. 6 is a flowchart showing an example of preprocessing for a reliability test of the solid-state imaging device according to the first embodiment of the present technology.

First, in the preprocessing for the reliability test, the solid-state imaging device 1 is subjected to baking treatment, as reset baking, under an atmosphere of an inert gas such as $N_2$, for example, as shown in FIG. 6 (S10). Here, for example, the baking treatment is performed at a temperature of 125° C. for 24 hours.

Next, hygroscopic treatment is performed on the solid-state imaging device 1 (S20). Here, for example, the hygroscopic treatment is performed for 192 hours under hygroscopic conditions of a temperature of 60° C. and a humidity of 90% RH.

Next, a reflow process is performed on the solid-state imaging device 1 (S30). Here, for example, the reflow process is performed three times at a maximum temperature of 260° C.

After the preprocessing is performed as described above, various tests are performed as reliability tests of the device (S40).

Thus, when the solid-state imaging device 1 is subjected to the preprocessing as described above, water vapor pressure in the cavity 5 increases during reflow (S30) and accordingly, stress is applied to the package structure.

Figure 7A:
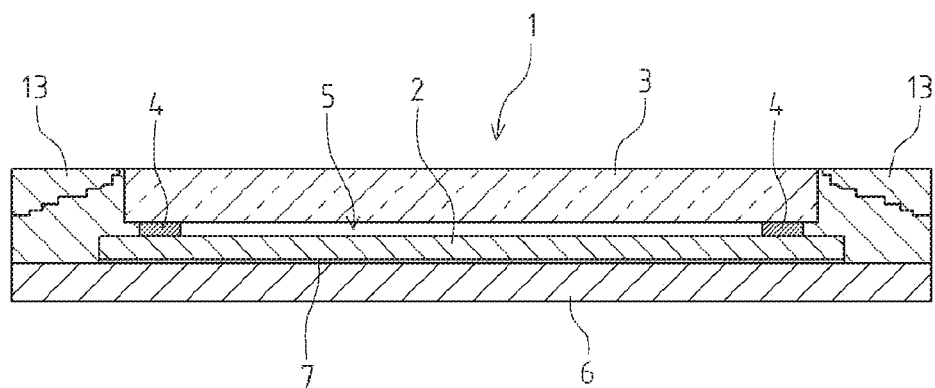
FIGS. 7A and 7B are diagrams showing a result of simulation regarding package stress during reflow of the solid-state imaging device according to the first embodiment of the present technology.
Figure 7B:
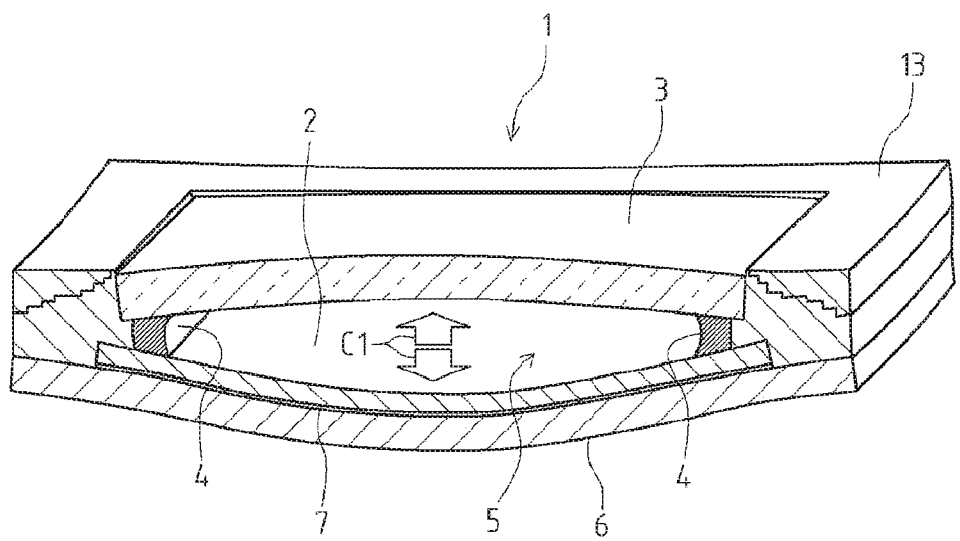
Figure 8:
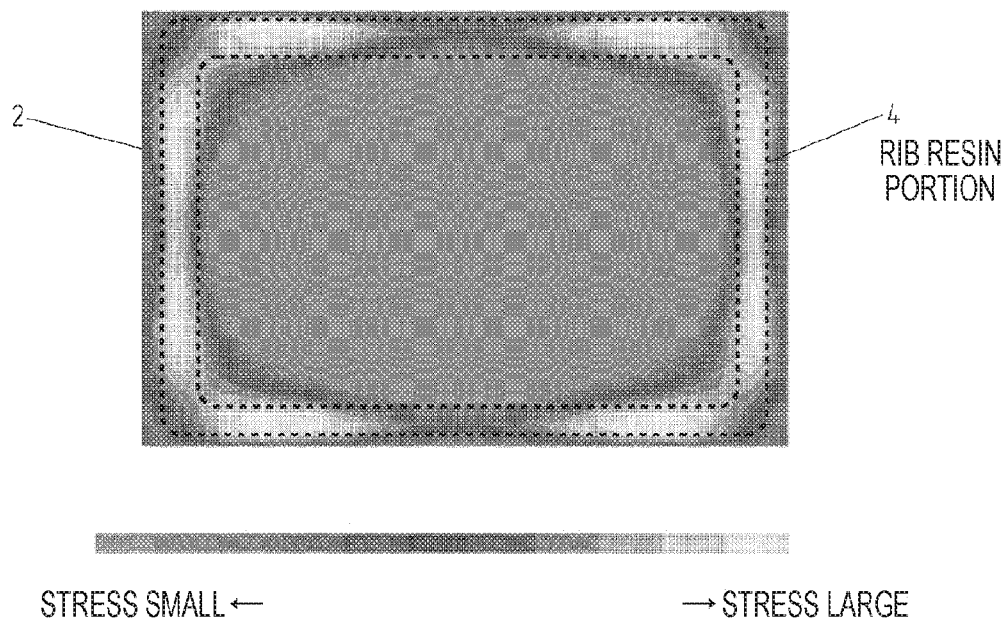
FIG. 8 is a diagram showing a result of simulation regarding plane stress of an image sensor during reflow of the solid-state imaging device according to the first embodiment of the present technology.

Here, the result of simulation of the stress acting on the solid-state imaging device 1 during the reflow will be described with reference to FIGS. 7A, 7B, and 8. FIG. 7A is a simulation diagram showing a cross section of the solid-state imaging device 1 before being subjected to preprocessing. FIG. 7B is a simulation diagram showing a state of the solid-state imaging device 1 during reflow.

As a result of performing the reflow process (S30) in the preprocessing, the water vapor pressure in the cavity 5 increases, and the package structure is subjected to the stress caused by the internal pressure of the cavity 5. Such stress acts mainly in the direction of expanding the cavity 5, that is, in the direction of separating the image sensor 2 and the glass sheet 3 from each other. Specifically, as seen from the transition from the state shown in FIG. 7A to the state shown in FIG. 7B, the solid-state imaging device 1 is subjected to a stress such that the central part of the image sensor 2 and the glass sheet 3, in which the cavity 5 is formed, vertically expands and deforms (see arrows C1).

In this way, the stress generated in the package structure concentrates on the rib resin portion 4 bonded to the surface portion of the image sensor 2. FIG. 8 is a diagram showing the result of simulation regarding plane stress of the image sensor 2 during the reflow of the solid-state imaging device 1. As understood from FIG. 8, relatively larger stress acts on a part of the image sensor 2 than on the other part. The part subjected to the relatively larger stress extends along the shape of the rib resin portion 4 having a rectangular frame shape in a plan view. Thus, the stress concentrates on the portion where the rib resin portion 4 is formed.

Thus, the stress that concentrates on the portion where the rib resin portion 4 is formed may cause peeling at the interface between relatively weakly bonded layers in the layer structure of the image sensor 2 located below the rib resin portion 4 in a case where the solid-state imaging device 1 is placed with the glass sheet 3 side up. A difference in thermal expansion coefficient between layers is one of causes that promote such peeling.

Examples of a combination of layers forming an interface with a relatively low adhesion include a combination of the light-shielding film 39 as a metal film and the flattening film 34 as an organic film including an organic material in the image sensor 2 of the present embodiment. That is, there is a concern that the stress acting on the package structure may cause peeling at the interface between the light-shielding film 39 and the flattening film 34 in the image sensor 2 during the reflow of the preprocessing.

Therefore, the solid-state imaging device 1 according to the present embodiment adopts the following configuration. The image sensor 2 has a layer structure provided on the light-receiving side of the semiconductor substrate 20. The layer structure includes the oxide film 33, the flattening film 34, and the light-shielding film 39. The oxide film 33 serves as a first layer. The flattening film 34 serves as a second layer that is different in material from the oxide film 33 and formed on the oxide film 33. The light-shielding film 39 serves as a third layer that is different in material from the oxide film 33 and formed in the flattening film 34 on the oxide film 33. As described above, in the present embodiment, the first layer is the oxide film 33, the second layer is the flattening film 34 including an organic material, and the third layer is the light-shielding film 39 including a metal material.

Then, as shown in FIG. 5, the light-shielding film 39 has a protrusion-and-recess shape portion 40 at least in a region where the rib resin portion 4 is formed in a planar direction along the plate surface of the semiconductor substrate 20 in the peripheral region 22 located below the rib resin portion 4. The protrusion-and-recess shape portion 40 forms the interface between the light-shielding film 39 and the flattening film 34 in a protrusion-and-recess shape. Here, the region where the rib resin portion 4 is formed refers to a portion that corresponds to the projection range of the rib resin portion 4 in the direction of the plate thickness of the image sensor 2 as indicated by reference sign D1 in FIG. 5, and overlaps the region where the rib resin portion 4 is formed in a plan view.

As shown in FIG. 5, a layer structure similar to that in the pixel region 21 also exists in the peripheral region 22 in the image sensor 2 of the present embodiment. Specifically, in the peripheral region 22, the light-shielding film 39 is formed on the oxide film 33, and the flattening film 34 is formed in such a way as to cover the light-shielding film 39. Furthermore, the color filter layer 35 lies on the flattening film 34, and the lens layer 37 lies on the color filter layer 35. In the peripheral region 22, the lens layer 37 is a layer portion including a material forming the microlens 36.

In the following description, each layer portion forming the layer structure in the peripheral region 22 is defined as follows. A layer portion corresponding to the oxide film 33 is referred to as an oxide film portion 33A. A layer portion corresponding to the light-shielding film 39 is referred to as a light-shielding film portion 39A. A layer portion corresponding to the flattening film 34 is referred to as a flattening film portion 34A. A layer portion corresponding to the color filter layer 35 is referred to as a color filter layer portion 35A. A layer portion corresponding to the lens layer 37 is referred to as a lens layer portion 37A. The lens layer portion 37A refers to a layer portion located outside a portion of the lens layer 37 where the microlens 36 is formed. Then, the lens layer portion 37A, the color filter layer portion 35A, the flattening film portion 34A, the light-shielding film portion 39A, and the oxide film portion 33A lie, in order from the top, below the rib resin portion 4 to form the layer structure of the image sensor 2.

In such a configuration, the light-shielding film portion 39A forms the protrusion-and-recess shape portion 40. The light-shielding film portion 39A is formed as a linear layer portion (ridge portion) along the array direction of the pixels 23 in a plan view (see FIG. 9), and has a protruding shape on the oxide film 33 in a side cross-sectional view (see FIG. 5). The light-shielding film portion 39A is formed in a grid-like shape, in a plan view, along the two-dimensional array direction of the pixels 23, that is, along a first direction (vertical direction in FIG. 9) and a second direction (horizontal direction in FIG. 9) orthogonal thereto.

Accordingly, the light-shielding film portion 39A includes a plurality of first light-shielding film portions 39A1 and a plurality of second light-shielding film portions 39A2. The plurality of first light-shielding film portions 39A1 is formed along the first direction in parallel with each other at predetermined intervals. The plurality of second light-shielding film portions 39A2 is formed along the second direction in parallel with each other at predetermined intervals. The arrangement interval between the light-shielding film portions 39A is not particularly limited, but the light-shielding film portions 39A are formed at a pitch of, for example, 1 µm.

As with the light-shielding film 39 in the pixel region 21, the light-shielding film portion 39A is provided in the flattening film portion 34A on the oxide film 33, and is covered with the flattening film portion 34A. Therefore, the light-shielding film portion 39A and the flattening film portion 34A are formed in such a way as to engage with each other in the layer thickness direction, and are partially formed such that the light-shielding film portion 39A and the flattening film portion 34A are located at a common position in the layer thickness direction. Note that FIG. 9 corresponds to an end cross-sectional view taken along line B-B in FIG. 5.

Furthermore, a wide light-shielding film portion 39Aw is formed such that the wide light-shielding film portion 39Aw is located on the pixel region 21 side (on the right side in FIG. 5) with respect to the plurality of first light-shielding film portions 39A1 in the peripheral region 22. The wide light-shielding film portion 39Aw is larger in width than a plurality of the other first light-shielding film portions 39A1 with a substantially constant width. The wide light-shielding film portion 39Aw is formed as a linear ridge portion along the first direction in parallel with the first light-shielding film portions 39A1, at a predetermined distance from the first light-shielding film portion 39A1 located on the pixel region 21 side. Furthermore, the wide light-shielding film portion 39Aw is connected to end portions of the light-shielding film 39 on the peripheral region 22 side along the second direction in the pixel region 21. The height of the light-shielding film portion 39A is substantially constant as a whole, and is the same as or substantially the same as the height of the light-shielding film 39 in the pixel region 21.

Figure 9:
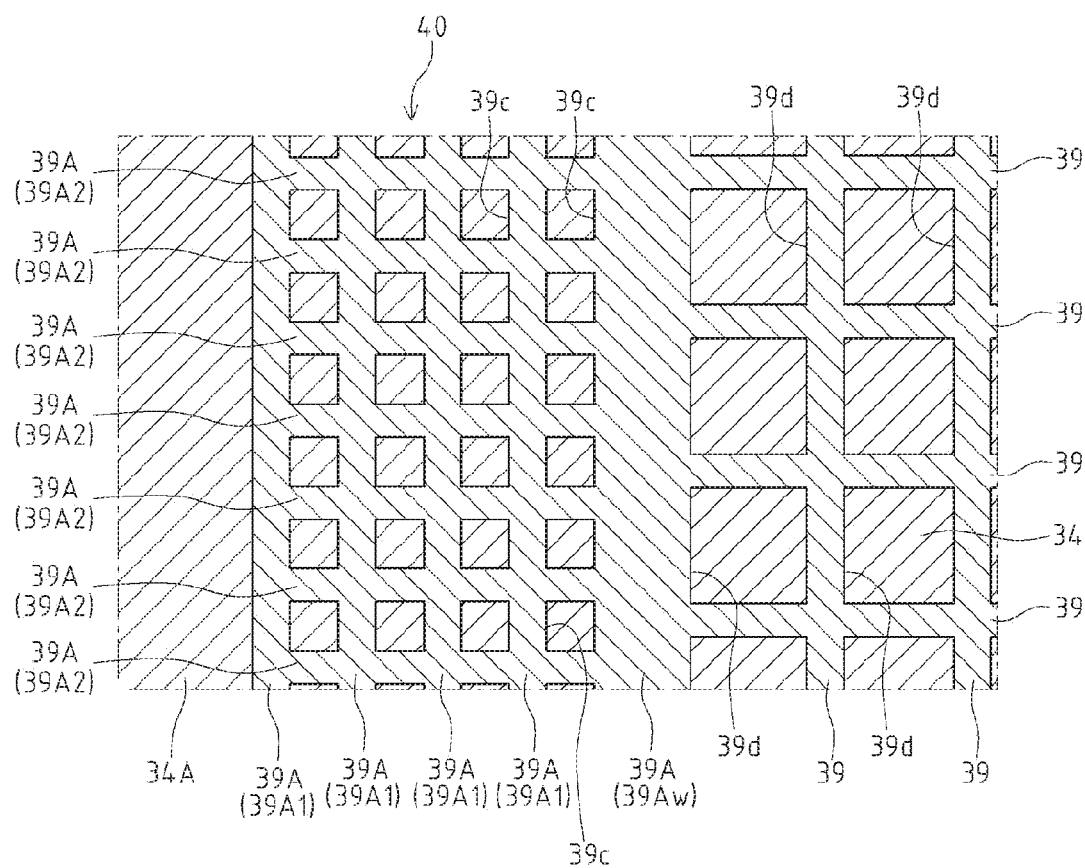
FIG. 9 is a plan sectional view of the configuration of the solid-state imaging element according to the first embodiment of the present technology.

As shown in FIG. 9, the light-shielding film portion 39A is formed in a grid-like shape, and forms square-shaped openings 39c on the oxide film 33. Each opening 39c has a substantially square shape in a plan view.

In the present embodiment, the light-shielding film portion 39A in the peripheral region 22 is formed such that the grid is finer than that of the light-shielding film 39 in the pixel region 21, as shown in FIG. 9. That is, the intervals between the light-shielding film portions 39A adjacent to each other in each of the first direction and the second direction are narrower than the arrangement interval of the light-shielding film 39 formed in a grid-like shape along boundaries between the pixels in the pixel region 21. Therefore, the openings 39c formed by the light-shielding film portions 39A formed in a grid-like shape in the peripheral region 22 are smaller than openings 39d formed by the light-shielding film 39 formed in a grid-like shape in the pixel region 21. However, the size of the grid of the light-shielding film portion 39A may be larger (rougher) than the grid of the light-shielding film 39, or may be substantially equal.

The light-shielding film portions 39A form protrusions, and the openings 39c form recesses in the protrusion-and-recess shape portion 40 with a configuration in which the light-shielding film portions 39A are arranged in a grid pattern as described above. The protrusion-and-recess shape portion 40 causes the interface between the light-shielding film portion 39A and the flattening film portion 34A to be in a protrusion-and-recess shape.

Furthermore, the light-shielding film portion 39A is substantially tapered from the lower side toward the upper side in cross-section with respect to its extending direction in a case where the image sensor 2 is placed with its light-receiving side (upper side in FIG. 5) up. Specifically, the light-shielding film portion 39A has inclined surfaces 39s and 39s on both sides in the width direction and an upper end surface 39t, as surfaces forming a substantially tapered cross-sectional shape. The light-shielding film portion 39A has a narrow trapezoidal shape or truncated isosceles triangular shape in a cross-sectional view.

Furthermore, in the present embodiment, the protrusion-and-recess shape portion 40 is formed in such a way as to partially cover the surface of the oxide film 33. The plurality of light-shielding film portions 39A forming the protrusion-and-recess shape portion 40 partially covers a surface 33a of the oxide film portion 33A. A part of the protrusion-and-recess shape portion 40 other than the light-shielding film portions 39A corresponds to a portion where the surface 33a of the oxide film portion 33A is exposed in a case where the flattening film portion 34A is removed. In such a portion, the flattening film portion 34A lies on the surface 33a of the oxide film portion 33A. That is, in the protrusion-and-recess shape portion 40, the opening 39C as a recess is formed as a penetrating opening.

However, the protrusion-and-recess shape portion 40 may be formed such that the opening 39C is formed as a depressed and bottomed recess instead of being formed in such a way as to penetrate to the oxide film portion 33A. That is, the protrusion-and-recess shape portion 40 may be partially formed in a protrusion-and-recess shape on the upper side of the light-shielding film 39 in the direction of thickness of the light-shielding film 39. In this case, the light-shielding film 39 includes a ridge portion and a layer portion. The ridge portion is grid-shaped, and extends in each of the first direction and the second direction. The layer portion lies below the ridge portion. The grid-shaped ridge portion forms rectangular depressed portions.

According to the image sensor 2 according to the present embodiment with the configuration as described above and the solid-state imaging device 1 including the same, it is possible to prevent peeling at an interface between layers forming the layer structure of the image sensor 2 even in a case where stress is caused by an increase in pressure in the cavity 5 in the configuration in which the glass sheet 3 is provided on the image sensor 2 with the rib resin portion 4 interposed therebetween and the cavity 5 is formed between the image sensor 2 and the glass sheet 3.

In the present embodiment, the interface between the light-shielding film portions 39A and the flattening film portion 34A is formed in a protrusion-and-recess shape by the protrusion-and-recess shape portion 40 formed by the light-shielding film portions 39A formed in a grid-like shape. Thus, it is possible to enhance adhesion between the layers due to the anchor effect in the layer structure below the rib resin portion 4 in the image sensor 2. That is, the protrusion-and-recess shape portion 40 can achieve the effect of a mechanical bond between the light-shielding film portion 39A and the flattening film portion 34A, due to the anchor effect. Thus, it is possible to improve adhesion between layers. Furthermore, the protrusion-and-recess shape portion 40 can increase the area of the interface between the light-shielding film portions 39A and the flattening film portion 34A. Accordingly, adhesion between layers can be improved by the effect of a chemical bond between respective materials forming the layers.

Figure 10A:
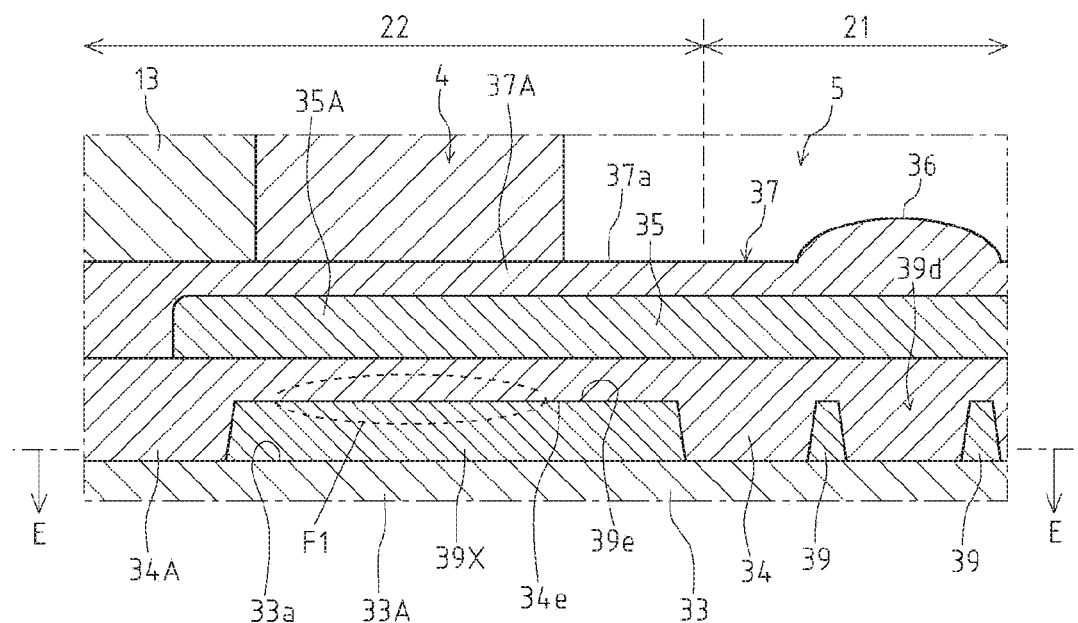
FIGS. 10A and 10B are diagrams showing a configuration of a solid-state imaging device of a comparative example with respect to the present technology.
Figure 10B:
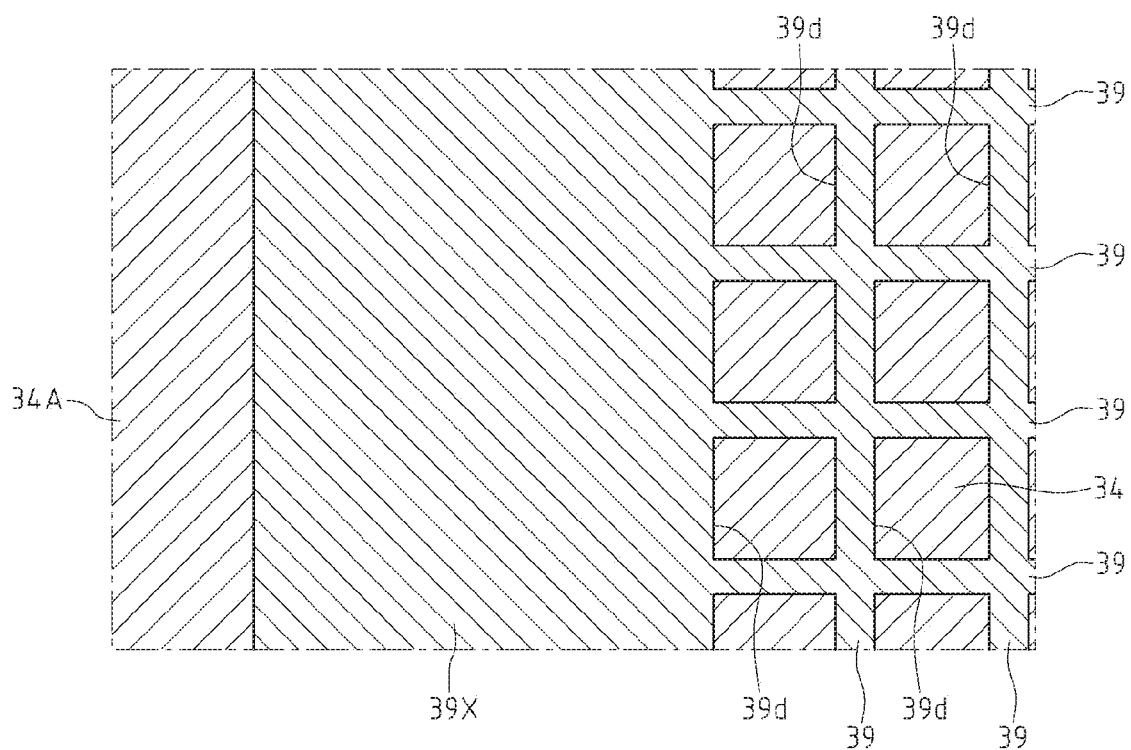

Here, a configuration in which the light-shielding film 39 does not have the protrusion-and-recess shape portion 40, as shown in FIGS. 10A and 10B, is assumed as a configuration of a comparative example with respect to the solid-state imaging device 1 according to the present embodiment. In the configuration of this comparative example, a flat layered light-shielding film portion 39X is formed as the light-shielding film 39 in the peripheral region 22. That is, in the configuration of the comparative example, the greater part of the interface between the light-shielding film portion 39X and the flattening film portion 34A forms an upper surface 39e of the light-shielding film portion 39X, which is a flat surface. Note that FIG. 10B corresponds to an end cross-sectional view taken along line E-E in FIG. 10A.

In such a configuration of the comparative example, since the light-shielding film portion 39X has a flat pattern, the adhesion between the light-shielding film portion 39A and the flattening film portion 34A is weakened. Therefore, there is a concern that stress acting on the package structure may cause peeling at the interface between the light-shielding film portion 39A and the flattening film portion 34A during the reflow of the preprocessing as described above. Specifically, in the configuration of this comparative example, peeling is likely to occur mainly between the upper surface 39e of the light-shielding film portion 39X and a lower surface 34e of the flattening film portion 34A (see a portion shown as dashed ellipse F1) below the rib resin portion 4 on which stress concentrates, as shown in FIG. 10A.

In contrast, the light-shielding film portion 39A has the protrusion-and-recess shape portion 40 in the solid-state imaging device 1 according to the present embodiment, as described above. As a result, the effect of improving adhesiveness can be achieved by a combination of mechanical and chemical bonds. This can achieve a robust layer structure below the rib resin portion 4. Thus, it is possible to prevent peeling at the interface between the layers of the light-shielding film portion 39A and the flattening film portion 34A even if stress acts on the package structure during the reflow of the preprocessing.

Furthermore, the solid-state imaging device 1 according to the present embodiment adopts a configuration in which the protrusion-and-recess shape portion 40 is provided in the light-shielding film 39. Therefore, it is possible to achieve enhancement of adhesion between layers in the layer structure below the rib resin portion 4 while maintaining the current process without increasing the number of steps of manufacturing the image sensor 2 or affecting the characteristics of the pixels of the image sensor 2. Specifically, such enhancement is achieved as follows.

That is, it is conceivable that another layer such as an oxide film, for example, is interposed between the light-shielding film 39 and the flattening film 34 so as to improve adhesion therebetween. However, interposing another layer between the light-shielding film 39 and the flattening film 34 requires addition of a step of forming the another layer. This increases the number of steps of manufacturing the image sensor 2. Furthermore, when another layer is newly added, a total film formation amount changes in the image sensor 2, so that it is necessary to redesign the layer structure in terms of film thickness management from the viewpoint of maintaining pixel characteristics. Therefore, the solid-state imaging device 1 according to the present embodiment can achieve the effects as described above without requiring an increase in the number of steps, the redesign of the layer structure, or the like.

Furthermore, according to the solid-state imaging device 1 according to the present embodiment, it is not necessary to change a filter pattern in the color filter layer 35 in improving the adhesion between the layers below the rib resin portion 4. Therefore, for example, there is no concern about a stripe pixel defect, so-called flare, which occurs in a case where a high-luminance light source is imaged.

When applied to a device in which the rib resin portion 4 for supporting the glass sheet 3 is provided in the peripheral region 22 as with the solid-state imaging device 1 according to the present embodiment, the image sensor 2 according to the present embodiment can improve the adhesion between the light-shielding film portion 39A and the flattening film portion 34A as described above even if stress acts on the package structure during reflow of preprocessing. Thus, it is possible to prevent peeling at the interface between these layers.

<2. Modified Examples of First Embodiment>

In addition to a grid-like shape as shown in FIG. 6, it is also possible to adopt various other shapes as the plan-view shape of the protrusion-and-recess shape portion 40 provided in the light-shielding film 39. Described below are variations of the plan-view shape of a portion forming a protrusion-and-recess shape as modified examples of the protrusion-and-recess shape portion 40 provided in the image sensor 2, regarding the solid-state imaging device 1 according to the present embodiment. Note that plan sectional views shown in FIGS. 11A, 11B, 11C, 11D, 12A, 12B, 12C, and 12D are each an end cross-sectional view taken along line B-B in FIG. 5.

(First Modified Example)

In a first modified example, a protrusion-and-recess shape portion 40 formed by a light-shielding film 39 has a vertically striped pattern (vertical pattern) shape in a plan view, as shown in FIG. 11A. Specifically, an image sensor 2 includes a plurality of linear light-shielding film portions 39H along a first direction as portions forming the protrusion-and-recess shape portion 40 in a peripheral region 22. The plurality of light-shielding film portions 39H is formed in parallel with each other at predetermined intervals. The arrangement interval between the light-shielding film portions 39H is not particularly limited, but is, for example, approximately 1 μm.

Furthermore, a wide light-shielding film portion 39Hw is formed on a pixel region 21 side (on the right side in FIG. 11A) of the plurality of light-shielding film portions 39H in the peripheral region 22. The wide light-shielding film portion 39Hw is larger in width than the plurality of light-shielding film portions 39H with a substantially constant width. The wide light-shielding film portion 39Hw is formed as a linear ridge portion along the first direction at a predetermined distance from the light-shielding film portion 39H located on the pixel region 21 side. The wide light-shielding film portion 39Hw is connected to end portions of the light-shielding film 39 on the peripheral region 22 side along a second direction in the pixel region 21.

(Second Modified Example)

In a second modified example, a protrusion-and-recess shape portion 40 formed by a light-shielding film 39 has a horizontally striped pattern (horizontal pattern) shape in a plan view, as shown in FIG. 11B. Specifically, an image sensor 2 includes a plurality of linear light-shielding film portions 39J along a second direction as portions forming the protrusion-and-recess shape portion 40 in a peripheral region 22. The plurality of light-shielding film portions 39J is formed in parallel with each other at predetermined intervals. The arrangement interval between the light-shielding film portions 39J is not particularly limited, but is, for example, approximately 1 μm.

Furthermore, as with the wide light-shielding film portion 39Hw in the first modified example, a wide light-shielding film portion 39Jw is formed in the peripheral region 22 such that the wide light-shielding film portion 39Jw is connected to end portions of the light-shielding film 39 along the second direction, the end portions being located on the peripheral region 22 side in a pixel region 21. The wide light-shielding film portion 39Jw is connected to end portions of the plurality of light-shielding film portions 39J, the end portions being located on the pixel region 21 side (right side in FIG. 11B). Furthermore, a linear light-shielding film portion 39K is formed along a first direction on a side (left side in FIG. 11B, hereinafter referred to as "contra-pixel region side") opposite to the pixel region 21 side of the plurality of light-shielding film portions 39J. The light-shielding film portion 39K is connected to end portions of the plurality of light-shielding film portions 39J, the end portions being located on the contra-pixel region side. Therefore, in the second modified example, the adjacent light-shielding film portions 39J, the wide light-shielding film portion 39Jw, and the light-shielding film portion 39K form rectangular openings 39Ja along a direction in which the light-shielding film portions 39J extend.

(Third Modified Example)

In a third modified example, a protrusion-and-recess shape portion 40 formed by a light-shielding film 39 has an oblique pattern shape in a plan view, as shown in FIG. 11C. Specifically, an image sensor 2 includes a plurality of linear inclined light-shielding film portions 39L along a predetermined inclination direction that is inclined with respect to a first direction and a second direction, as portions forming the protrusion-and-recess shape portion 40 in a peripheral region 22. The plurality of inclined light-shielding film portions 39L is formed in parallel with each other at predetermined intervals. The arrangement interval between the inclined light-shielding film portions 39L is not particularly limited, but is, for example, approximately 1 μm.

Furthermore, as with the wide light-shielding film portion 39Hw in the first modified example, a wide light-shielding film portion 39Lw is formed in the peripheral region 22 such that the wide light-shielding film portion 39Lw is connected to end portions of the light-shielding film 39 along the second direction, the end portions being located on the peripheral region 22 side in a pixel region 21. The wide light-shielding film portion 39Lw is connected to end portions of the plurality of inclined light-shielding film portions 39L, the end portions being located on the pixel region 21 side (right side in FIG. 11C). Furthermore, a linear light-shielding film portion 39M is formed along the first direction on the contra-pixel region side of the plurality of inclined light-shielding film portions 39L. The light-shielding film portion 39M is connected to end portions of the plurality of inclined light-shielding film portions 39L, the end portions being located on the contra-pixel region side. Therefore, in the third modified example, the adjacent inclined light-shielding film portions 39L, the wide light-shielding film portion 39Lw, and the light-shielding film portion 39M form parallelogram-shaped openings 39La along a direction in which the inclined light-shielding film portions 39L extend. Note that although not shown, the protrusion-and-recess shape portion 40 may have an oblique pattern shape in which the plurality of inclined light-shielding film portions 39L is inclined in a direction opposite to the inclination direction shown in FIG. 11C (diagonally right up in the drawing).

(Fourth Modified Example)

In a fourth modified example, a protrusion-and-recess shape portion 40 formed by a light-shielding film 39 has an oblique grid pattern shape in a plan view, as shown in FIG. 11D. Specifically, an image sensor 2 includes a plurality of linear first inclined light-shielding film portions 39N and a plurality of linear second inclined light-shielding portions 39O, as portions forming the protrusion-and-recess shape portion 40 in a peripheral region 22. The plurality of first inclined light-shielding film portions 39N is formed along a first inclination direction inclined with respect to a first direction and a second direction. The plurality of second inclined light-shielding portions 39O is formed along a second inclination direction inclined in a direction opposite to the first inclination direction. Each of the plurality of first inclined light-shielding film portions 39N and the plurality of second inclined light-shielding portions 39O is formed in parallel with each other at predetermined intervals to form a grid pattern. Each of the arrangement interval between the first inclined light-shielding film portions 39N and the arrangement interval between the second inclined light-shielding portions 39O is not particularly limited, but is, for example, approximately 1 μm.

Furthermore, as with the wide light-shielding film portion 39Hw in the first modified example, a wide light-shielding film portion 39Nw is formed in the peripheral region 22 such that the wide light-shielding film portion 39Nw is connected to end portions of the light-shielding film 39 along the second direction, the end portions being located on the peripheral region 22 side in a pixel region 21. The wide light-shielding film portion 39Nw is connected to end portions of the plurality of first inclined light-shielding film portions 39N and second inclined light-shielding portions 39O, the end portions being located on the pixel region 21 side (right side in FIG. 11D). Furthermore, a linear light-shielding film portion 39P is formed along the first direction on the contra-pixel region side of the plurality of first inclined light-shielding film portions 39N and second inclined light-shielding portions 39O. The light-shielding film portion 39P is connected to end portions of the plurality of first inclined light-shielding film portions 39N and second inclined light-shielding portions 39O, the end portions being located on the contra-pixel region side. In the fourth modified example, openings 39Na are formed by the first inclined light-shielding film portions 39N, the second inclined light-shielding portions 39O, the wide light-shielding film portion 39Nw, and the light-shielding film portion 39P. The openings 39Na are formed in a rhombic shape or a shape corresponding to a part of a rhombus (triangular shape, or the like).

(Fifth Modified Example)

Figure 12A:
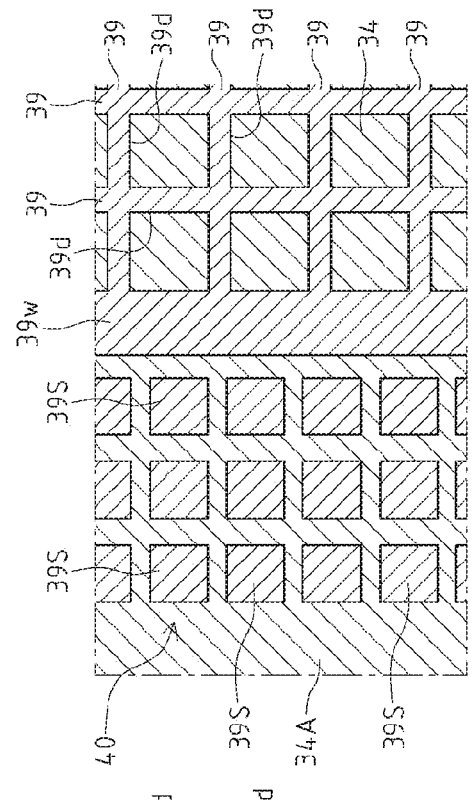
FIGS. 12A, 12B, 12C, and 12D are plan sectional views of configurations of modified examples of the solid-state imaging element according to the first embodiment of the present technology.

In a fifth modified example, a protrusion-and-recess shape portion 40 formed by a light-shielding film 39 has a zigzag pattern shape in a plan view, as shown in FIG. 12A. Specifically, an image sensor 2 includes a plurality of bent light-shielding film portions 39Q formed in a zigzag shape (step-like shape) along a first direction and a second direction, as portions forming the protrusion-and-recess shape portion 40 in a peripheral region 22. The plurality of bent light-shielding film portion 39Q is formed in parallel with each other at predetermined intervals. The arrangement interval between the bent light-shielding film portions 39Q is not particularly limited, but is, for example, approximately 1 µm.

Furthermore, as with the wide light-shielding film portion 39Hw in the first modified example, a wide light-shielding film portion 39Qw is formed in the peripheral region 22 such that the wide light-shielding film portion 39Qw is connected to end portions of the light-shielding film 39 along the second direction, the end portions being located on the peripheral region 22 side in a pixel region 21. The wide light-shielding film portion 39Qw is connected to end portions of the plurality of bent light-shielding film portions 39Q, the end portions being located on the pixel region 21 side (right side in FIG. 12A). Furthermore, a linear light-shielding film portion 39R is formed along the first direction on the contra-pixel region side of the plurality of bent light-shielding film portions 39Q. The light-shielding film portion 39R is connected to end portions of the plurality of bent light-shielding film portions 39Q, the end portions being located on the contra-pixel region side. Therefore, in the fifth modified example, the adjacent bent light-shielding film portions 39Q, the wide light-shielding film portion 39Qw, and the light-shielding film portion 39R form zigzag-shaped openings 39Qa along the bent shape of the bent light-shielding film portions 39Q. Note that the zigzag pattern of the protrusion-and-recess shape portion 40 is not limited to the pattern shown in FIG. 12A, and a pattern with an appropriate bent shape is also applicable.

(Sixth Modified Example)

Figure 12B:
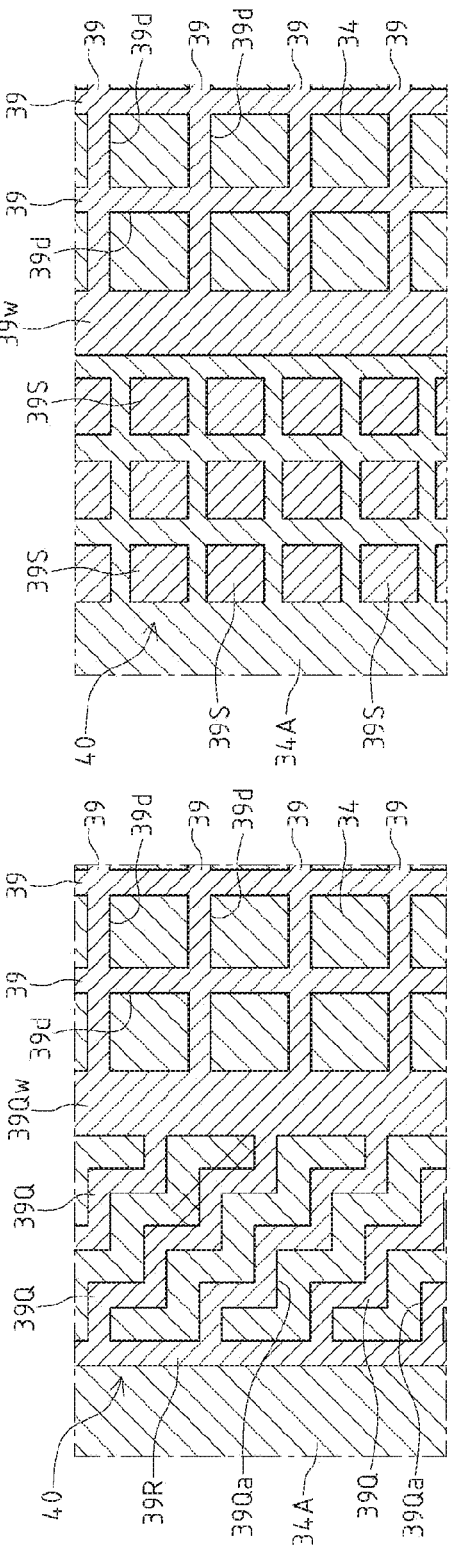

In a sixth modified example, a protrusion-and-recess shape portion 40 formed by a light-shielding film 39 has a quadrangular dot pattern in a plan view, as shown in FIG. 12B. Specifically, an image sensor 2 includes a plurality of rectangular light-shielding film portions 39S formed in a quadrangular shape, as portions forming the protrusion-and-recess shape portion 40 in a peripheral region 22. The plurality of rectangular light-shielding film portions 39S is formed such that the plurality of rectangular light-shielding film portions 39S is orderly arranged at predetermined intervals in a first direction and a second direction along a pixel array. In the example shown in FIG. 12B, the rectangular light-shielding film portion 39S is smaller than a rectangular opening 39d formed by the grid-like light-shielding film 39 in the peripheral region 22. The arrangement interval between the rectangular light-shielding film portions 39S is not particularly limited, but is, for example, approximately 1 µm.

Furthermore, as with the wide light-shielding film portion 39Hw in the first modified example, a wide light-shielding film portion 39w is formed in the peripheral region 22 such that the wide light-shielding film portion 39w is connected to end portions of the light-shielding film 39 along the second direction, the end portions being located on the peripheral region 22 side in a pixel region 21. Note that the rectangular light-shielding film portion 39S may have a rectangular shape, for example.

(Seventh Modified Example)

Figure 12C:
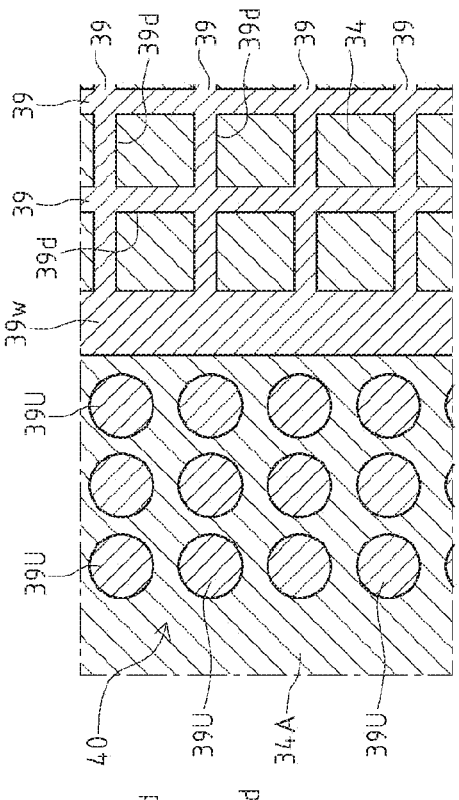

In contrast to the sixth modified example shown in FIG. 12B, a protrusion-and-recess shape portion 40 formed by a light-shielding film 39 in a seventh modified example has a rhombic dot pattern in a plan view, as shown in FIG. 12C. Specifically, an image sensor 2 includes a plurality of rhombic light-shielding film portions 39T formed in a rhombic shape, as portions forming the protrusion-and-recess shape portion 40 in a peripheral region 22. The plurality of rhombic light-shielding film portions 39T is formed such that the plurality of rhombic light-shielding film portions 39T is orderly arranged at predetermined intervals in a first direction and a second direction along a pixel array. The arrangement interval between the rhombic light-shielding film portions 39T is not particularly limited, but is, for example, approximately 1 µm.

(Eighth Modified Example)

Figure 12D:
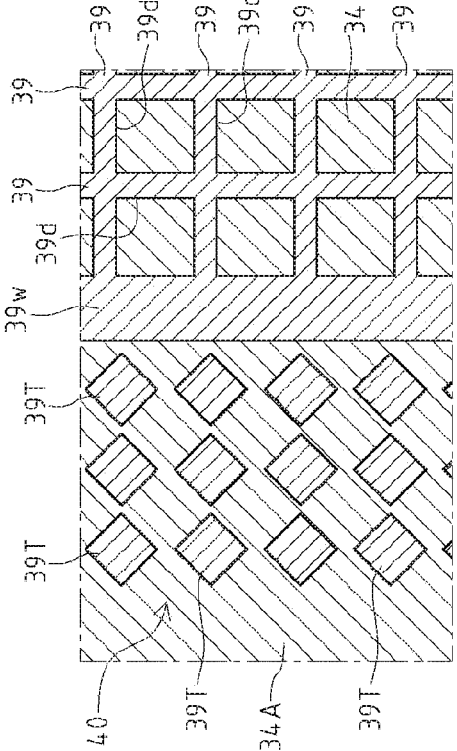

In contrast to the sixth modified example shown in FIG. 12B, a protrusion-and-recess shape portion 40 formed by a light-shielding film 39 in an eighth modified example has a circular dot pattern in a plan view, as shown in FIG. 12D. Specifically, an image sensor 2 includes a plurality of circular light-shielding film portions 39U formed in a circular shape, as portions forming the protrusion-and-recess shape portion 40 in a peripheral region 22. The plurality of circular light-shielding film portions 39U is formed such that the plurality of circular light-shielding film portions 39U is orderly arranged at predetermined intervals in a first direction and a second direction along a pixel array. The arrangement interval between the circular light-shielding film portions 39U is not particularly limited, but is, for example, approximately 1 µm.

The configuration of each of the modified examples as described above can also achieve the effects as described above. Furthermore, the arrangement interval between the ridge portions formed as portions forming the protrusion-and-recess shape portion 40, the depth and other dimensions of the recesses, and the like are set depending on the materials of the oxide film 33, the flattening film 34, and the light-shielding film 39, a layer structure, and the like such that an optimum anchor effect can be achieved so as to cause the layers of the flattening film 34 and the light-shielding film 39 to closely adhere to each other.

3. Second Embodiment

A second embodiment of the present technology will be described. Note that constituent elements common to the first embodiment are denoted by the same reference signs, and description thereof will be omitted as appropriate. A solid-state imaging device according to the present embodiment is different from the solid-state imaging device according to the first embodiment in that a protrusion-and-recess shape portion is formed also on an oxide film 33 located below a light-shielding film 39.

Figure 13:
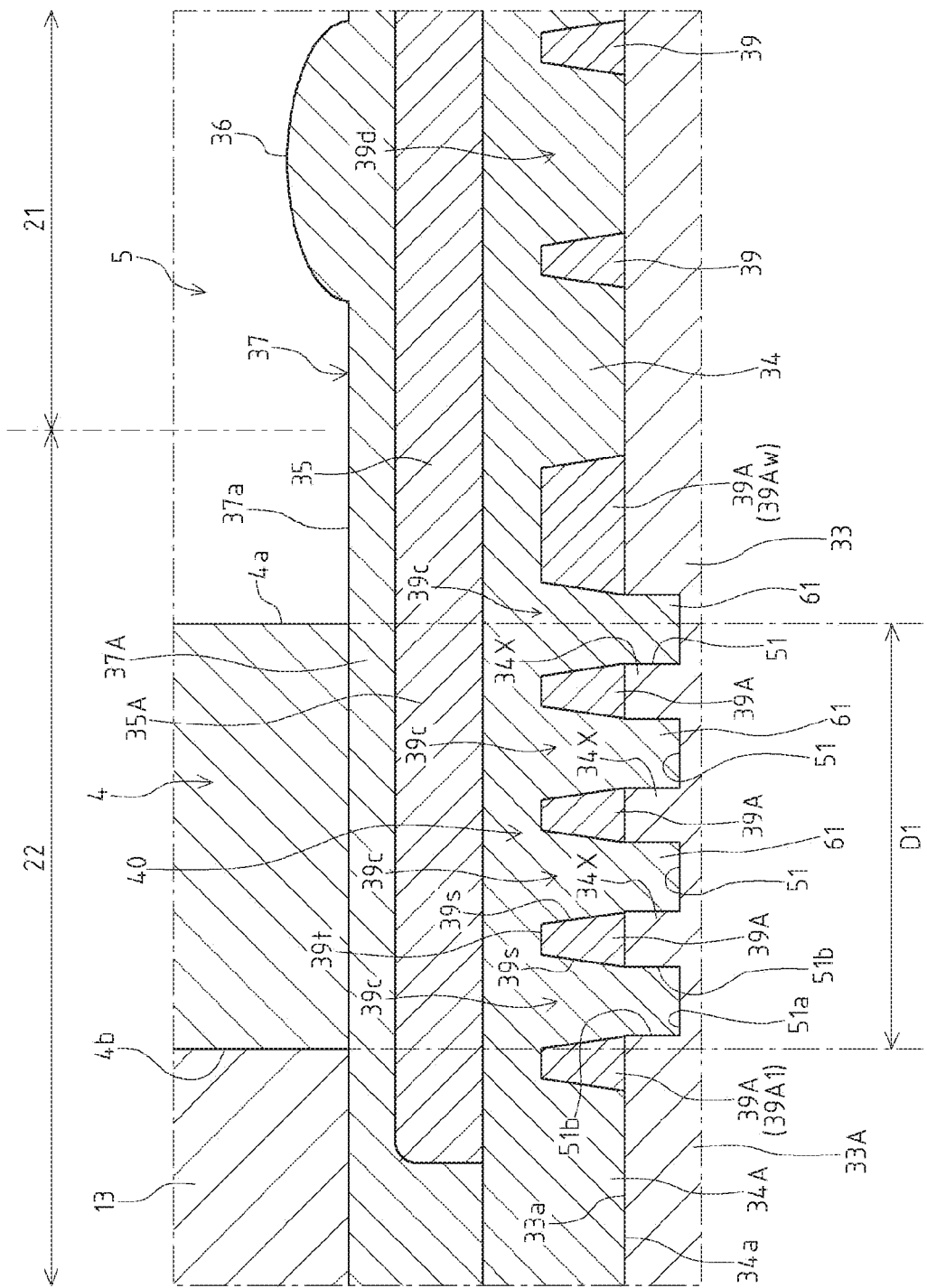
FIG. 13 is a cross-sectional view of a configuration of a solid-state imaging device according to a second embodiment of the present technology.

As shown in FIG. 13, in the solid-state imaging device according to the present embodiment, the oxide film 33 has a recessed portion 51 in an oxide film portion 33A. The recessed portion 51 is continuous with an opening 39c that is a recess of a protrusion-and-recess shape portion 40. Accordingly, a flattening film 34 has a protruding portion 61 on the light-shielding film 39 side, that is, the lower side of a flattening film portion 34A. The protruding portion 61 is formed as a result of filling the recessed portion 51 through the opening 39c. Note that as with FIG. 5, FIG. 13 is an enlarged view of a part corresponding to part A1 in FIG. 1.

In a layer structure in which the light-shielding film 39 and the flattening film 34 are formed on the upper side of the oxide film 33, the recessed portion 51 is formed as a recess in the upper side of the oxide film portion 33A in such a way as to extend the opening shape of the opening 39c formed by a light-shielding film portion 39A downward. The recessed portions 51 are formed in the oxide film portion 33A of a peripheral region 22 along the shape of the openings 39c formed by the grid-like light-shielding film portions 39A in a plan view. Therefore, the recessed portions 51 each have a substantially square shape, and are arranged to form a square-shape pattern in a plan view, in such a way as to correspond to the openings 39c formed in a square shape on the oxide film 33.

The protruding portion 61 is a portion that closes the recessed portion 51 in the flattening film portion 34A, and has a protruding shape that fits the recessed shape of the recessed portion 51. Therefore, the protruding portion 61 is a protrusion having a cubic shape or a rectangular parallelepiped shape and protruding downward (toward the oxide film 33 side) with respect to a lower surface 34a of the flattening film portion 34A which is a mating surface with a surface 33a of the oxide film portion 33A.

In the present embodiment, the recessed portion 51 is an excavation that forms a key-like protrusion-and-recess shape together with the other recessed portions 51 in a cross-sectional view of the layer structure including the oxide film 33, the light-shielding film 39, and the flattening film 34. Specifically, each recessed portion 51 has a cross-sectional shape that follows a rectangular shape with an opening on the upper side. Therefore, the recessed portion 51 has a bottom surface 51a and side wall surfaces 51b and 51b that are parallel to each other and are perpendicular to the bottom surface 51a, as surfaces forming the cross-sectional shape that follows a rectangular shape.

In the configuration in which a plurality of the recessed portions 51 is formed in the oxide film portion 33A, the oxide film portion 33A has linear ridge portions 34X extending in each of a first direction and a second direction. These ridge portions 34X are formed in a grid-like shape along the first direction and the second direction along the plan-view shape of the light-shielding film portion 39A. The width of the ridge portion 34X is substantially the same as the width of the bottom surface of the light-shielding film portion 39A. Therefore, an inclined surface 39s of the light-shielding film portion 39A and the side wall surface 51b serving as a side surface of the ridge portion 34X are continuous with each other in a bent shape.

As described above, in the present embodiment, the recessed portion 51 of the oxide film portion 33A and the protruding portion 61 of the flattening film portion 34A cause the cross-sectional shape of the interface between these layers to be in a key-like protrusion-and-recess shape, that is, a rectangular wave-like protrusion-and-recess shape in a cross-sectional view of the layer structure of the image sensor 2.

According to the image sensor 2 according to the present embodiment and a solid-state imaging device 1 including the same, it is possible to effectively prevent peeling at the interface between the layers forming the layer structure of the image sensor 2.

Specifically, in the present embodiment, a protrusion-and-recess shape formed by the recessed portions 51, which are formed in such a way as to be continuous with the openings 39c, causes the interface between the layers of the oxide film portion 33A and the flattening film portion 34A to be in a protrusion-and-recess shape in the layer structure below a rib resin portion 4 in the image sensor 2. Thus, the adhesion between the layers can be enhanced by the anchor effect. That is, the recessed portion 51 can achieve the effect of a mechanical bond between the oxide film portion 33A and the flattening film portion 34A due to the anchor effect. Thus, the adhesion between the layers can be improved. Furthermore, the recessed portion 51 can increase the area of the interface between the oxide film portion 33A and the flattening film portion 34A. Therefore, the adhesion between the layers can be improved by the effect of the chemical bond between respective materials forming the layers.

As described above, the solid-state imaging device according to the present embodiment can achieve not only the effect of adhesion being improved by a combination of the mechanical bond and the chemical bond between the light-shielding film portion 39A and the flattening film portion 34A due to the protrusion-and-recess shape portion 40, but also the effect of adhesion being improved by a combination of the mechanical bond and the chemical bond between the flattening film portion 34A and the oxide film portion 33A due to the recessed portion 51. As a result, further robustness of the layer structure below the rib resin portion 4 can be achieved. Thus, it is possible to effectively prevent peeling at the interface between the layers of the light-shielding film portion 39A and the flattening film portion 34A even if stress acts on the package structure during reflow of preprocessing.

4. Modified Example of Second Embodiment

Figure 14:
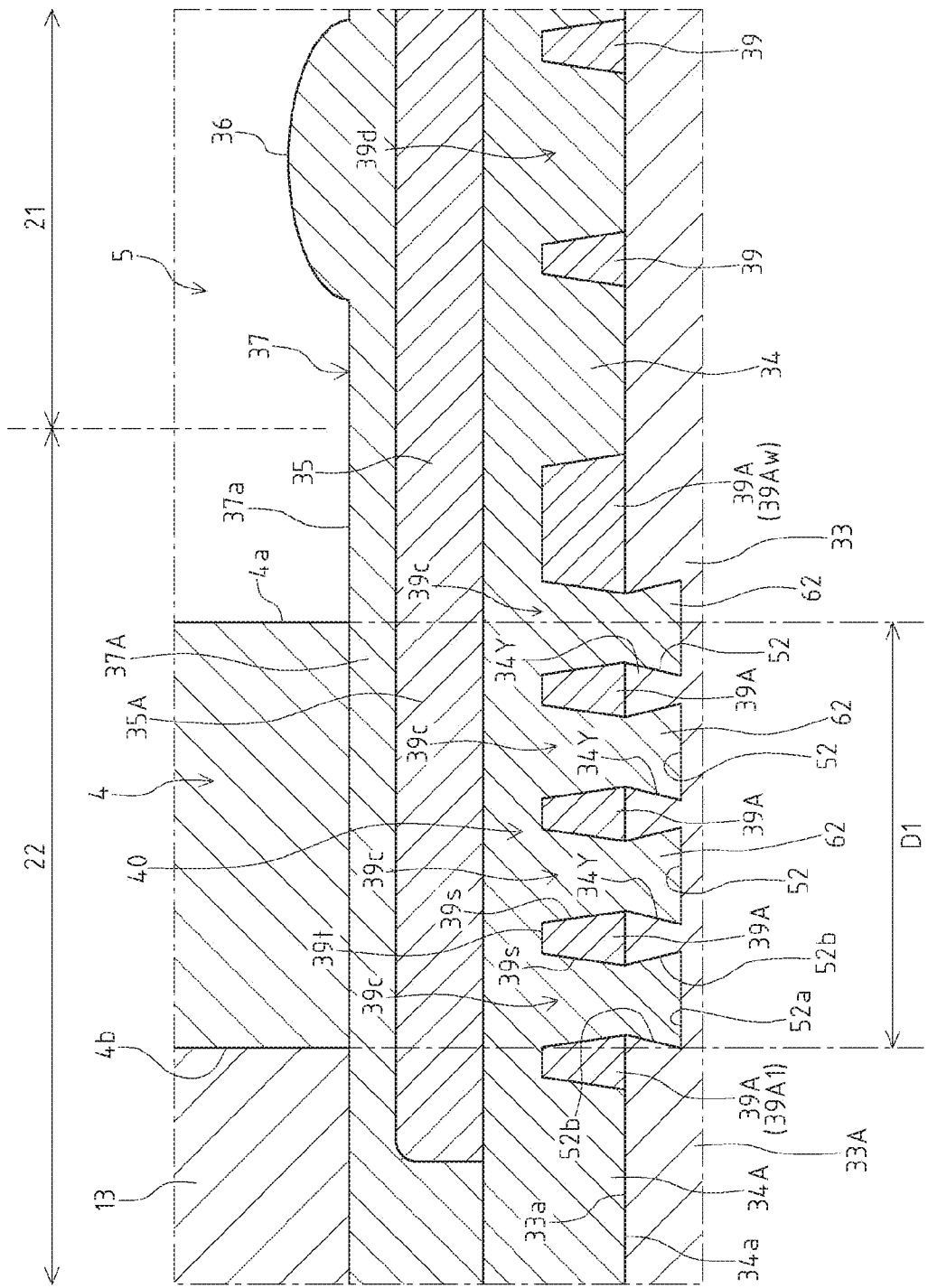
FIG. 14 is a cross-sectional view of a configuration of a modified example of the solid-state imaging device according to the second embodiment of the present technology.

A modified example of the solid-state imaging device according to the present embodiment will be described with reference to FIG. 14. As shown in FIG. 14, in this modified example, a recessed portion 52 formed in an oxide film portion 33A has a trapezoidal groove shape gradually increasing in width from the light-receiving side (upper side in FIG. 14) of an image sensor 2 toward the opposite side (lower side in FIG. 14) in a direction (vertical direction in FIG. 14) of the thickness of a layer structure including an oxide film 33, a light-shielding film 39, and a flattening film 34, in a cross-sectional view of the layer structure.

Specifically, each recessed portion 52 has a cross-sectional shape that follows a trapezoidal shape with an opening on the upper side. Therefore, the recessed portion 52 has a bottom surface 52a and inclined side wall surfaces 52b and 52b, as surfaces forming a cross-sectional shape that follows the trapezoidal shape. The distance between the side wall surfaces 52b and 52b gradually increases from the upper side (opening side) toward the lower side.

In the configuration in which a plurality of the recessed portions 52 is formed in the oxide film portion 33A, the oxide film portion 33A has linear ridge portions 34Y extending in each of a first direction and a second direction. These ridge portions 34Y are formed in a grid-like shape along the first direction and the second direction along the plan-view shape of light-shielding film portions 39A. The ridge portion 34Y has an inverted trapezoidal (reverse taper) cross-sectional shape gradually increasing in width from the lower side to the upper side. The width of the upper surface of the ridge portion 34Y is substantially the same as the width of the bottom surface of the light-shielding film portion 39A. Therefore, an inclined surface 39s of the light-shielding film portion 39A and the side wall surface 52b serving as a side surface of the ridge portion 34Y are continuous with each other in a bent shape.

As with the recessed portions 51 shown in FIG. 13, the recessed portions 52 are formed on the upper side of the oxide film portion 33A in such a way as to extend the opening shape of openings 39c formed by the light-shielding film portion 39A downward. The recessed portions 52 each have a substantially square shape, and are arranged to form a square-shape pattern in a plan view, in such a way as to correspond to the openings 39c. Furthermore, a protruding portion 62 formed on a flattening film portion 34A as a result of filling the recessed portion 52 is a portion that closes the recessed portion 52 in the flattening film portion 34A, and has a protruding shape that fits the recessed shape of the recessed portion 52, as with the protruding portion 61 shown in FIG. 13.

As described above, in this modified example, the recessed portion 52 of the oxide film portion 33A and the protruding portion 62 of the flattening film portion 34A cause the cross-sectional shape of the interface between these layers to be in a protrusion-and-recess shape in which inverted trapezoidal protrusions larger in width at protruding ends are engaged with each other in a cross-sectional view of the layer structure of the image sensor 2.

With such a configuration, the recessed portion 52 can improve the effect of the mechanical bond between the oxide film portion 33A and the flattening film portion 34A due to the anchor effect. Thus, the adhesion between the layers can be improved. As a result, it is possible to obtain a stronger bonding action between layers against peeling at the interface between the layers of the light-shielding film portion 39A and the flattening film portion 34A, and it is possible to prevent peeling more effectively.

Note that it is possible to apply, also in the present embodiment, various variations of the plan-view shape as modified examples of the protrusion-and-recess shape portion 40 set forth in the first embodiment. Then, in each variation, the recessed portions 51 and 52 are formed in the oxide film portion 33A, at positions where the light-shielding film portion does not exist such as positions where openings are provided in the light-shielding film portion.

[Image Sensor Manufacturing Method]

An example of a method for manufacturing the image sensor 2 according to the present embodiment will be described with reference to FIGS. 15A, 15B, 15C, 15D, 15E, and 15F. Described here is a manufacturing method for a configuration of a modified example in which an oxide film portion 33A has a reverse-taper recessed portion 52, as shown in FIG. 14.

As shown in FIG. 15A, in the process of manufacturing the image sensor 2, a metal film 71 to be a light-shielding film 39 is formed on an oxide film 33 formed on a back surface 20b side of a semiconductor substrate 20 (see FIG. 4). The metal film 71 is formed in a film forming step of forming a film with a metal material such as aluminum or tungsten. In the film forming step, for example, a sputtering method, a chemical vapor deposition (CVD) method, a plating process, or the like is used to form the metal film 71 including a predetermined metal material.

After the film forming step, there is performed a mask step of selectively forming a resist mask 72 on the metal film 71 formed in the film forming step, as shown in FIG. 15A. In the mask step, the resist mask 72 is formed by patterning using a photolithography technique. The resist mask 72 is formed in a region corresponding to the light-shielding film 39 in a pixel region 21, and formed in a region corresponding to a light-shielding film portion 39A in a peripheral region 22. A known resist material can be used as the material of the resist mask 72.

Next, as shown in FIG. 15B, there is performed a removal step of selectively removing the metal film 71 through the resist mask 72. In the removal step, the resist mask 72 is removed by dry etching, and the metal film 71 is selectively removed by etching. Note that wet etching may be used instead of dry etching. As a result, the light-shielding film 39 including the light-shielding film portions 39A is formed.

Subsequently, as shown in FIG. 15C, there is performed a mask step of selectively forming a resist mask 73 on the light-shielding film 39. In the mask step, the resist mask 73 is formed by patterning using a photolithography technique.

The resist mask 73 is formed in a region of the oxide film portion 33A other than a region where the recessed portions 52 are formed. A known resist material can be used as the material of the resist mask 73.

Next, as shown in FIG. 15D, there is performed a removal step of partially removing the oxide film portion 33A through the resist mask 73. In the removal step, the light-shielding film portions 39A function as masks to form the recessed portions 52 by wet etching.

Then, as shown in FIG. 15E, the resist mask 73 is removed by, for example, dry etching.

Thereafter, as shown in FIG. 15F, a flattening film 34, a color filter layer 35, and a lens layer 37 are formed, in this order, by a known method, and the image sensor 2 is completed. The image sensor 2 according to the second embodiment is manufactured as described above.

5. Third Embodiment

A third embodiment of the present technology will be described. Note that constituent elements common to the first embodiment are denoted by the same reference signs, and description thereof will be omitted as appropriate. A solid-state imaging device according to the present embodiment is different from the solid-state imaging device according to the first embodiment in that a light-shielding film portion of a light-shielding film 39 is not provided in a region where a rib resin portion 4 is formed (see reference sign D1 in FIG. 5).

Figure 16A:
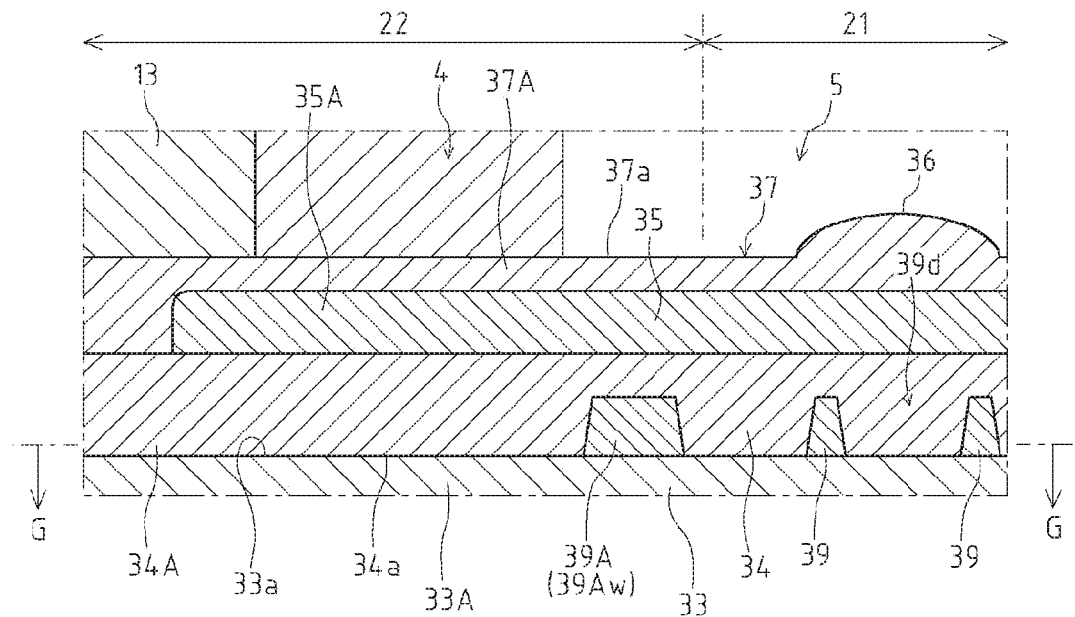
FIGS. 16A and 16B are cross-sectional views of a configuration of a solid-state imaging device according to a third embodiment of the present technology.
Figure 16B:
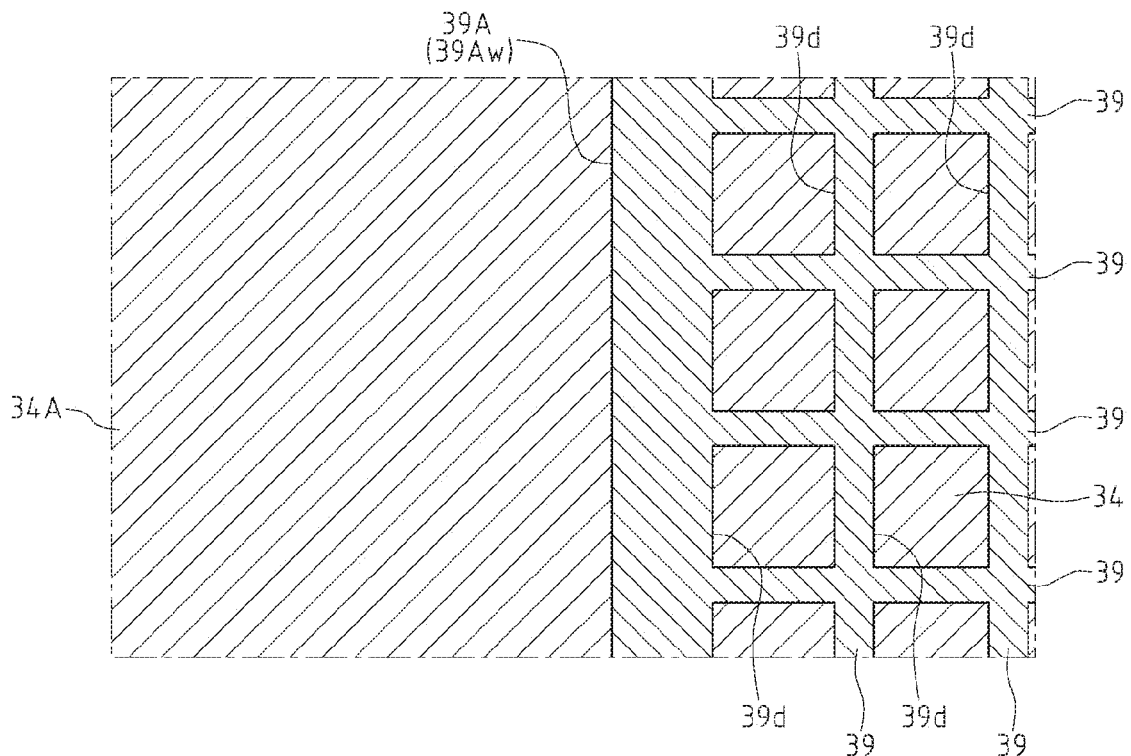

As shown in FIGS. 16A and 16B, in the solid-state imaging device according to the present embodiment, only a wide light-shielding film portion 39Aw is formed as a light-shielding film portion 39A in a peripheral region 22. Thus, the light-shielding film 39 (light-shielding film portion 39A) does not exist and no protrusion-and-recess shape portion 40 is formed below the rib resin portion 4. Therefore, in the greater part of the peripheral region 22 including the region below the rib resin portion 4, a flat interface is formed by a surface 33a of an oxide film portion 33A and a lower surface 34a of a flattening film portion 34A. Note that as with FIG. 5, FIG. 16A is an enlarged view of a part corresponding to part A1 in FIG. 1, and FIG. 16B corresponds to an end cross-sectional view taken along line G-G in FIG. 16A.

Such a configuration can be easily implemented as a result of forming no resist mask in a range including a region corresponding to the region below the rib resin portion 4 in patterning using a photolithography technique at the time of forming the light-shielding film 39 in the process of manufacturing an image sensor 2.

According to the image sensor 2 according to the present embodiment and a solid-state imaging device 1 including the same, the following effects can be achieved.

Peeling is relatively less likely to occur at the interface between layers of an oxide film 33 and a flattening film 34 than at the interface between layers of the flattening film 34 and the light-shielding film 39, due to the relationship between respective materials forming the layers. That is, the oxide film 33 including a silicon oxide film or the like can achieve higher adhesion to the flattening film 34 including an organic material than the light-shielding film 39 including a metal material. Therefore, it is possible to prevent peeling at the interface between the layers forming the layer structure of the image sensor 2 by causing the oxide film portion 33A and the flattening film portion 34A to adhere to each other in such a way as to form a planar interface as a whole without interposing the light-shielding film portion 39A in the layer structure below the rib resin portion 4.

6. Modified Example of Third Embodiment

Figure 17:
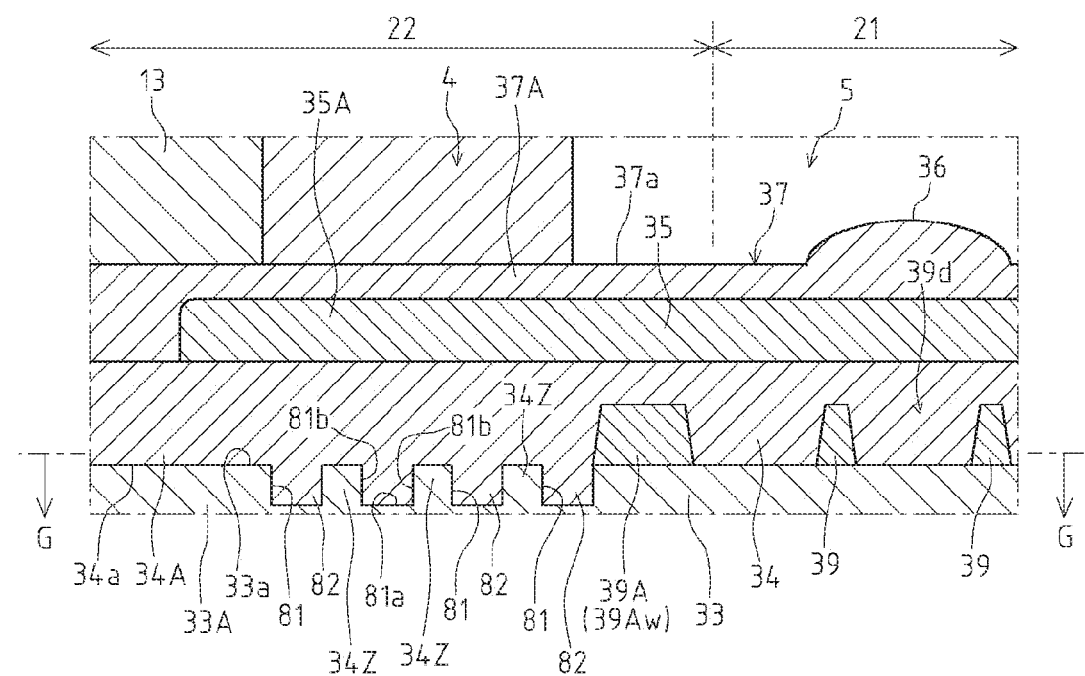
FIG. 17 is a cross-sectional view of a configuration of a modified example of the solid-state imaging device according to the third embodiment of the present technology.

A modified example of the solid-state imaging device according to the present embodiment will be described with reference to FIG. 17. As shown in FIG. 17, in this modified example, as shown in FIG. 17, an oxide film 33 has a recessed portion 81 in an oxide film portion 33A in the solid-state imaging device according to the present embodiment. Accordingly, a flattening film 34 has a protruding portion 82 on a flattening film portion 34A formed as a result of filling the recessed portion 81.

The recessed portion 81 is formed as a recess on the upper side of the oxide film portion 33A in a layer structure in which the flattening film 34 is formed on the upper side of the oxide film 33. As with the recessed portions 51 in the second embodiment, the recessed portions 81 each have, for example, a substantially square shape in a plan view, and are arranged to form a square-shape pattern in the oxide film portion 33A of a peripheral region 22.

The protruding portion 82 is a portion that closes the recessed portion 81 in the flattening film portion 34A, and has a protruding shape that fits the recessed shape of the recessed portion 81. Therefore, the protruding portion 82 is a protrusion having a cubic shape or a rectangular parallelepiped shape and protruding downward (toward the oxide film 33 side) with respect to a lower surface 34a of the flattening film portion 34A which is a mating surface with a surface 33a of the oxide film portion 33A.

In the present embodiment, the recessed portion 81 is an excavation that forms a key-like protrusion-and-recess shape together with the other recessed portions 81 in a cross-sectional view of the layer structure including the oxide film 33 and the flattening film 34. Specifically, each recessed portion 81 has a cross-sectional shape that follows a rectangular shape with an opening on the upper side. Therefore, the recessed portion 81 has a bottom surface 81a and side wall surfaces 81b and 81b that are parallel to each other and are perpendicular to the bottom surface 81a, as surfaces forming the cross-sectional shape that follows a rectangular shape.

In the configuration in which a plurality of the recessed portions 81 is formed in the oxide film portion 33A, the oxide film portion 33A has linear ridge portions 34Z extending in each of a first direction and a second direction. These ridge portions 34Z are formed in a grid-like shape along the first direction and the second direction.

As described above, in the present embodiment, the recessed portion 81 of the oxide film portion 33A and the protruding portion 82 of the flattening film portion 34A cause the cross-sectional shape of the interface between these layers to be in a key-like protrusion-and-recess shape, that is, a rectangular wave-like protrusion-and-recess shape in a cross-sectional view of the layer structure of an image sensor 2.

The recessed portion 81 of the oxide film portion 33A is formed in, for example, a mask step of forming a resist mask on the oxide film portion 33A by patterning using a photolithography technique, and a removal step of partially removing a portion corresponding to the recessed portion 81 from the oxide film portion 33A through the resist mask.

According to the image sensor 2 according to this modified example and a solid-state imaging device 1 including the same, the following effects can be achieved in addition to the effects of the present embodiment described above.

In this modified example, a protrusion-and-recess shape formed by the recessed portions 81 causes the interface between the layers of the oxide film portion 33A and the flattening film portion 34A to be in a protrusion-and-recess shape in the layer structure below a rib resin portion 4 in the image sensor 2. Thus, the adhesion between the layers can be enhanced by the anchor effect. That is, the recessed portion 81 can achieve the effect of a mechanical bond between the oxide film portion 33A and the flattening film portion 34A due to the anchor effect. Thus, the adhesion between the layers can be improved. Furthermore, the recessed portion 81 can increase the area of the interface between the oxide film portion 33A and the flattening film portion 34A. Therefore, the adhesion between the layers can be improved by the effect of the chemical bond between respective materials forming the layers.

As described above, the solid-state imaging device according to this modified example can achieve the effect of adhesion being improved by a combination of the mechanical bond and the chemical bond between the flattening film portion 34A and the oxide film portion 33A due to the recessed portion 81. As a result, it is possible to effectively prevent peeling at the interface between the layers of the oxide film portion 33A and the flattening film portion 34A even if stress acts on the package structure during reflow of preprocessing.

Furthermore, the recessed portion 81 to be formed in the oxide film portion 33A may have a shape that follows a trapezoidal shape with an opening on the upper side, as with the recessed portion 52 shown in FIG. 14. In this case, the recessed portion 81 has a bottom surface and inclined side wall surfaces, as surfaces forming a cross-sectional shape that follows the trapezoidal shape. The distance between the side wall surfaces gradually increases from the upper side (opening side) toward the lower side. With such a configuration, it is possible to improve the effect of the mechanical bond between the oxide film portion 33A and the flattening film portion 34A due to the anchor effect. Thus, the adhesion between the layers can be improved.

Note that in the present embodiment, the shape of the recessed portion 81 is not particularly limited as long as the recessed portion 81 causes the interface between the oxide film portion 33A and the flattening film portion 34A to be in a protrusion-and-recess shape. The recessed portions 81 may be formed in a grid-like shape along the first direction and the second direction, for example. In this case, the recessed portions 81 are formed as linear grooves along each of the first direction and the second direction. Furthermore, it is possible to apply, to the plan-view shape of the recessed portion 81, various variations of the plan-view shape as modified examples of the protrusion-and-recess shape portion 40 set forth in the first embodiment. In this case, in each variation, the shape of the recessed portion 81 may be a shape adapted to a portion corresponding to the light-shielding film portion or a shape adapted to a portion corresponding to the flattening film portion.

The above description of each embodiment is an example of the present disclosure, and the present disclosure is not limited to the above embodiments. Therefore, it goes without saying that various modifications can be made so as to implement an embodiment other than each of the above-described embodiments depending on the design and the like without departing from the technical idea according to the present disclosure. Furthermore, the effects described in the present disclosure are merely illustrative and not restrictive, and other effects may also be achieved.

In the above embodiments, the image sensor 2, which is a CMOS type image sensor, has been described as an example of the solid-state imaging element. However, the present technology can be widely applied to solid-state imaging devices including other types of solid-state imaging element such as a CCD type solid-state imaging element, for example, in addition to a CMOS type solid-state imaging element.

Furthermore, the above-described embodiments have each adopted, as a configuration for forming the cavity 5 between the image sensor 2 and the glass sheet 3, a configuration in which the glass sheet 3 is supported on the image sensor 2 with the rib resin portion 4 interposed between the glass sheet 3 and the image sensor 2. However, the present technology is not limited thereto. For example, it is also possible to adopt, as a configuration for forming the cavity 5 between the image sensor 2 and the glass sheet 3, a configuration in which a glass sheet is mounted on a molding resin provided around the image sensor 2 with a sealant or the like interposed between the glass sheet and the molding resin to form a cavity.

Furthermore, in the above-described embodiments, the rib resin portion 4 including a resin material that functions as an adhesive such as a photosensitive adhesive has been described as an example of a support portion that supports the glass sheet 3 on the image sensor 2. However, the support portion according to the present technology is not limited to such a support portion. For example, the support portion according to the present technology may be formed by a combination of a resin material that functions as an adhesive and a spacer member including a resin material containing an appropriate amount of filler (for example, carbon fiber, carbon nanotube, ceramic particles, low melting point alloy, and the like). Here, examples of the resin material for forming the spacer member include ABS resin, polycarbonate, and polyphenylene sulfide resin.

Note that the present technology can adopt the following configurations.

(1) A Solid-State Imaging Device Including:

a solid-state imaging element including a semiconductor substrate, one of plate surface sides of the semiconductor substrate being defined as a light-receiving side;

a translucent member provided on the light-receiving side of the solid-state imaging element at a predetermined distance from the solid-state imaging element; and a support portion that is provided on the light-receiving side of the solid-state imaging element, and supports the translucent member with respect to the solid-state imaging element in such a way as to form a cavity between the solid-state imaging element and the translucent member, in which the solid-state imaging element has a layer structure provided on the light-receiving side of the semiconductor substrate, the layer structure including a first layer, a second layer, and a third layer, the second layer being different in material from the first layer and formed on the first layer, the third layer being different in material from the first layer and formed in the second layer on the first layer, and the third layer has a protrusion-and-recess shape portion at least in a region where the support portion is formed in a planar direction along the plate surface of the semiconductor substrate, the protrusion-and-recess shape portion forming an interface between the second layer and the third layer in a protrusion-and-recess shape.

(2) The solid-state imaging device according to (1) above, in which the support portion includes a resin material, and is provided in a peripheral region that is a region other than a light-receiving region on the light-receiving side of the solid-state imaging element, the second layer is a flattening film including an organic material, and the third layer is a light-shielding film including a metal material.

(3) The solid-state imaging device according to (1) or (2) above, in which the protrusion-and-recess shape portion is formed in such a way as to partially cover a surface of the first layer.

(4) The solid-state imaging device according to (3) above, in which the first layer has a recessed portion continuous with a recess of the protrusion-and-recess shape portion, and the second layer has a protruding portion on the third layer side, the protruding portion being formed as a result of filling the recessed portion through the recess.

(5) The solid-state imaging device according to (4) above, in which the recessed portion is an excavation that forms a key-like protrusion-and-recess shape together with other recessed portions in a cross-sectional view of the layer structure.

(6) The solid-state imaging device according to (4) above, in which the recessed portion has a trapezoidal groove shape gradually increasing in width from the light-receiving side toward an opposite side in a direction of thickness of the layer structure in a cross-sectional view of the layer structure.

(7) A solid-state imaging element including:

a semiconductor substrate, one of plate surface sides of the semiconductor substrate being defined as a light-receiving side on which a support portion is provided in such a way as to be interposed between the semiconductor substrate and a translucent member to be disposed, in which the solid-state imaging element has a layer structure provided on the light-receiving side of the semiconductor substrate, the layer structure including a first layer, a second layer, and a third layer, the second layer being different in material from the first layer and formed on the first layer, the third layer being different in material from the first layer and formed in the second layer on the first layer, and the third layer has a protrusion-and-recess shape portion at least in a region where the support portion is formed in a planar direction along the plate surface of the semiconductor substrate, the protrusion-and-recess shape portion forming an interface between the second layer and the third layer in a protrusion-and-recess shape.

REFERENCE SIGNS LIST

1 Solid-state imaging device
2 Image sensor (solid-state imaging element)
3 Glass sheet (translucent member)
4 Rib resin portion (support portion)
5 Cavity
20 Semiconductor substrate
21 Pixel region
22 Peripheral region
33 Oxide film (first layer)
33A Oxide film portion
34 Flattening film (second layer)
34A Flattening film portion
39 Light-shielding film (third layer)
39A Light-shielding film portion 39c Opening
40 Protrusion-and-recess shape portion
51 Recessed portion
52 Recessed portion
61 Protruding portion

The invention claimed is:

1. A solid-state imaging device comprising:
a solid-state imaging element including a semiconductor substrate, one of plate surface sides of the semiconductor substrate being defined as a light-receiving side;
a translucent member provided on the light-receiving side of the solid-state imaging element at a predetermined distance from the solid-state imaging element; and
a support portion that is provided on the light-receiving side of the solid-state imaging element, and supports the translucent member with respect to the solid-state imaging element in such a way as to form a cavity between the solid-state imaging element and the translucent member, wherein
the solid-state imaging element has a layer structure provided on the light-receiving side of the semiconductor substrate, the layer structure including a first layer, a second layer, and a third layer, the second layer being different in material from the first layer and formed on the first layer, the third layer being different in material from the first layer and formed in the second layer on the first layer, and
the third layer has a protrusion-and-recess shape portion at least in a region where the support portion is formed in a planar direction along a plate surface of the semiconductor substrate, the protrusion-and-recess shape portion forming an interface between the second layer and the third layer in a protrusion-and-recess shape.

2. The solid-state imaging device according to claim 1, wherein
the support portion includes a resin material, and is provided in a peripheral region that is a region other than a light-receiving region on the light-receiving side of the solid-state imaging element,
the second layer is a flattening film including an organic material, and
the third layer is a light-shielding film including a metal material.

3. The solid-state imaging device according to claim 2, wherein
the protrusion-and-recess shape portion is formed in such a way as to partially cover a surface of the first layer.

4. The solid-state imaging device according to claim 3, wherein
the first layer has a recessed portion continuous with a recess of the protrusion-and-recess shape portion, and
the second layer has a protruding portion on a side of the third layer, the protruding portion being formed as a result of filling the recessed portion through the recess.

5. The solid-state imaging device according to claim 4, wherein
the recessed portion is an excavation that forms a key-like protrusion-and-recess shape together with other recessed portions in a cross-sectional view of the layer structure.

6. The solid-state imaging device according to claim 4, wherein
the recessed portion has a trapezoidal groove shape gradually increasing in width from the light-receiving side toward an opposite side in a direction of thickness of the layer structure in a cross-sectional view of the layer structure.

7. A solid-state imaging element comprising:
a semiconductor substrate, one of plate surface sides of the semiconductor substrate being defined as a light-receiving side on which a support portion is provided in such a way as to be interposed between the semiconductor substrate and a translucent member to be disposed, wherein
the solid-state imaging element has a layer structure provided on the light-receiving side of the semiconductor substrate, the layer structure including a first layer, a second layer, and a third layer, the second layer being different in material from the first layer and formed on the first layer, the third layer being different in material from the first layer and formed in the second layer on the first layer, and
the third layer has a protrusion-and-recess shape portion at least in a region where the support portion is formed in a planar direction along a plate surface of the semiconductor substrate, the protrusion-and-recess shape portion forming an interface between the second layer and the third layer in a protrusion-and-recess shape.

* * * * *